United States Patent
Lee et al.

(10) Patent No.: US 11,765,259 B2
(45) Date of Patent: Sep. 19, 2023

(54) SPEAKER MODULE MOUNTING STRUCTURE AND ELECTRONIC DEVICE COMPRISING SAME

(71) Applicant: Samsung Electronics Co., Ltd., Suwon-si (KR)

(72) Inventors: Myungcheol Lee, Suwon-si (KR); Minyoung Gwak, Suwon-si (KR); Hyeonhak Kim, Suwon-si (KR); Youngbae Park, Suwon-si (KR); Jongjin Jeong, Suwon-si (KR); Seongho Cho, Suwon-si (KR); Hochul Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 229 days.

(21) Appl. No.: 17/368,280

(22) Filed: Jul. 6, 2021

(65) Prior Publication Data

US 2021/0337055 A1    Oct. 28, 2021

Related U.S. Application Data

(63) Continuation of application No. PCT/KR2019/017808, filed on Dec. 16, 2019.

(30) Foreign Application Priority Data

Jan. 4, 2019  (KR) .................. KR10-2019-0001141

(51) Int. Cl.
*H04M 1/03* (2006.01)
*H04M 1/02* (2006.01)
*H04R 1/02* (2006.01)

(52) U.S. Cl.
CPC ......... *H04M 1/035* (2013.01); *H04M 1/0277* (2013.01); *H04R 1/025* (2013.01); *H04R 1/026* (2013.01); *H04R 2499/11* (2013.01)

(58) Field of Classification Search
CPC .... H04M 1/035; H04M 1/0277; H04R 1/025; H04R 1/026; H04R 2499/11

USPC ......................................................... 381/334
See application file for complete search history.

(56) References Cited

U.S. PATENT DOCUMENTS

| | | | | |
|---|---|---|---|---|
| 10,225,645 | B1* | 3/2019 | Lv | ........................... H04R 1/021 |
| 10,993,021 | B2* | 4/2021 | Song | ..................... H04R 1/021 |
| 2004/0142731 | A1 | 7/2004 | Ho et al. | |
| 2011/0090652 | A1 | 4/2011 | Wee et al. | |
| 2014/0146992 | A1 | 5/2014 | Jun et al. | |

(Continued)

FOREIGN PATENT DOCUMENTS

| | | |
|---|---|---|
| CN | 204795204 U | 11/2015 |
| CN | 106412777 A | 2/2017 |

(Continued)

OTHER PUBLICATIONS

International Search Report dated Apr. 2, 2020, issued in International Application No. PCT/KR2019/017808.

(Continued)

*Primary Examiner* — Sean H Nguyen
(74) *Attorney, Agent, or Firm* — Jefferson IP Law, LLP

(57) ABSTRACT

An electronic device is provided. The electronic device includes a housing comprising a front plate facing a first direction, a back plate facing a second direction that is opposite the first direction, and an outer wall which encompasses the space between the front plate and the back plate and in which a pipe passage extending to the outside is arranged, a speaker module positioned in the space, which is adjacent to the pipe passage, a printed circuit board arranged along at least a part of the side surface of the speaker module and formed along the periphery of the region between the outer wall, having the pipe passage, and the speaker module, and a first sealing member arranged between the back plate and a bracket and formed into a closed loop along the edge of the speaker module.

15 Claims, 14 Drawing Sheets

(56) References Cited

U.S. PATENT DOCUMENTS

| | | |
|---|---|---|
| 2014/0177902 A1 | 6/2014 | Yeh |
| 2014/0301587 A1 | 10/2014 | Ji et al. |
| 2016/0037243 A1* | 2/2016 | Lippert .................. H04R 1/023 |
| | | 381/166 |
| 2016/0112781 A1 | 4/2016 | Lee et al. |
| 2016/0165327 A1 | 6/2016 | Crosby et al. |
| 2016/0323675 A1* | 11/2016 | Dai ...................... H04R 31/006 |
| 2017/0041693 A1 | 2/2017 | Jia et al. |
| 2017/0245032 A1 | 8/2017 | Yoon et al. |
| 2018/0132020 A1 | 5/2018 | Seo et al. |
| 2018/0227668 A1 | 8/2018 | Park et al. |

FOREIGN PATENT DOCUMENTS

| | | |
|---|---|---|
| EP | 2 736 227 A1 | 5/2014 |
| KR | 10-1391845 B1 | 5/2014 |
| KR | 10-2014-0067811 A | 6/2014 |
| KR | 10-2016-0044352 A | 4/2016 |
| KR | 10-2017-0098009 A | 8/2017 |
| KR | 10-2018-0052291 A | 5/2018 |
| KR | 10-2018-0092219 A | 8/2018 |

OTHER PUBLICATIONS

Korean Office Action dated Mar. 7, 2023, issued in Korean Patent Application No. 10-2019-0001141.
Chinese Office Action dated Mar. 30, 2023, issued in Chinese Patent Application No. 201980087980.4.

* cited by examiner

SPEAKER MODULE MOUNTING STRUCTURE AND ELECTRONIC DEVICE COMPRISING SAME

CROSS-REFERENCE TO RELATED APPLICATION(S)

This application is a continuation application, claiming priority under § 365(c), of an International application No. PCT/KR2019/017808, filed on Dec. 16, 2019, which is based on and claims priority of a Korean patent application number 10-2019-0001141, filed on Jan. 4, 2019, in the Korean Intellectual Property Office, the disclosure of which is incorporated by reference herein in its entirety.

BACKGROUND

1. Field

The disclosure relates to a speaker module mounting structure disposed in an inner space of an electronic device.

2. Description of Related Art

The term "electronic device" may mean a device, such as a home appliance, an electronic scheduler, a portable multimedia reproducer, a mobile communication terminal, a tablet personal computer (PC), an image/sound device, a desktop PC, a laptop PC, or a vehicle navigation system, that performs a specific function according to a program installed therein. The above-mentioned electronic devices may output, for example, information stored therein as sound or an image. As the degree of integration of electronic devices has increased and super-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, are integrated in a single electronic device, in addition to a communication function.

In general, some configurations of electronic devices are gradually becoming light, thin, short, and small while being provided with various functions to satisfy consumer desires. Various functions provided by such electronic devices include functions that are executed using audio modules. These audio modules (e.g., speakers and/or microphones) are capable of transmitting and receiving sound signals associated with the electronics device, the outside of the electronic devices, or users.

The above information is presented as background information only to assist with an understanding of the disclosure. No determination has been made, and no assertion is made, as to whether any of the above might be applicable as prior art with regard to the disclosure.

SUMMARY

In general, a speaker module is disposed inside an electronic device, and a printed circuit board provided with a contact with the speaker module may be disposed above or below the speaker module. As another example, the printed circuit board provided with a contact with a speaker module may be in the form of a closed loop shape with the speaker module interposed therebetween, and may be disposed to surround a side surface of the speaker module.

In a speaker module mounting structure disposed adjacent to a conduit facing the side surface of an electronic device, since the speaker module is mounted inside the printed circuit board in the form of the closed loop, the conduit may be disposed to extend above or below the printed circuit board, avoiding the printed circuit board. In this case, since the speaker module is moved to a side opposite to the sound radiation hole by the width of a portion of the printed circuit board, it is possible to increase the length of the conduit and to reduce the thickness (e.g., the diameter) of the conduit. The conduit may cause deterioration in a high-frequency band performance of the speaker module. In addition, the arrangement of the printed circuit board surrounding the speaker module and the increase in the length of the conduit may cause interference with adjacent peripheral H/W components (a camera, an antenna, etc.).

As another example, when a portion of the printed circuit board disposed on the side surface of the speaker module is disposed inside a resonance space of the speaker module, the resonance space may be reduced by the volume of the printed circuit board inserted into the inside. Reducing the resonance space of the speaker module may lead to deterioration of a low-frequency band performance.

According to various embodiments of the disclosure, by implementing a printed circuit board in which a conduit area including a sound radiating hole is open (e.g., removed), it is possible to reduce the length of the conduit, and to improve the high-frequency performance of the speaker module.

According to various embodiments of the disclosure, by minimizing the area of the printed circuit board entering the resonance space, it is possible to improve the low-frequency performance of the speaker module due to the expansion of the resonance space. In addition, it is possible to improve the mounting efficiency of the speaker module and other H/W components (a camera, an antenna, etc.).

Aspects of the disclosure are to address at least the above-mentioned problems and/or disadvantages and to provide at least the advantages described below. Accordingly, an aspect of the disclosure is to provide a speaker module mounting structure disposed in an inner space of an electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate facing a first direction, a rear plate facing a second direction opposite to the first direction, and an outer wall which surrounds a space between the front plate and the rear plate and in which a conduit extending to an outside is disposed, a speaker module located in the space adjacent to the conduit, a printed circuit board disposed along at least a portion of a side surface of the speaker module, and formed along a periphery of an area between the outer wall in which the conduit is disposed and the speaker module, and a first sealing member disposed between the rear plate and a bracket, and formed in a closed curve along an edge of the speaker module.

In accordance with another aspect of the disclosure, a speaker module mounting structure is provided. The Speaker module mounting structure includes a bracket including an outer wall and a conduit passing through the outer wall to an inner space, a plate disposed to face the bracket and coupled to the outer wall of the bracket to define the inner space, a speaker module located in the inner space adjacent to the conduit, a printed circuit board disposed along at least a portion of a side surface of the speaker module, and a first sealing member disposed between the plate and the bracket along an edge of the speaker module. The printed circuit board may have an open loop shape in which an area between the outer wall in which the conduit is provided and the speaker module, and may be disposed along the periphery of the open area so as to prevent overlapping between the conduit and a portion of the printed circuit board.

With the electronic device according to various embodiments of the disclosure, it is possible to implement a printed circuit board in an open loop shape in which a conduit area in which a sound emission hole is configured is open. Accordingly, it is possible to provide a speaker module with improved high-band performance by reducing the length of the conduit through which sound is transmitted to the outside.

With the electronic device according to various embodiments of the disclosure, it is possible to implement a printed circuit board in which an area inserted into the resonance space is minimized. Accordingly, it is possible to provide a speaker module with improved low-band performance due to the expansion of the resonance space.

With the electronic device according to various embodiments of the disclosure, it is possible to implement a mounting structure that shields the periphery of a printed circuit board inserted into the resonance space, thereby preventing sound waves from leaking through a path other than a predetermined section.

With the electronic device according to various embodiments of the disclosure, it is possible to design a printed circuit board and a conduit extending from a speaker module not to overlap each other, thereby improving mounting efficiency with other H/W components (a camera, an antenna, etc.).

In an electronic device according to various embodiments of the disclosure, since a portion of a rigid printed circuit board is directly electrically connected to a speaker module, it is possible to exclude the use of a flexible printed circuit board, thereby reducing a material cost and providing an improved signal performance.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
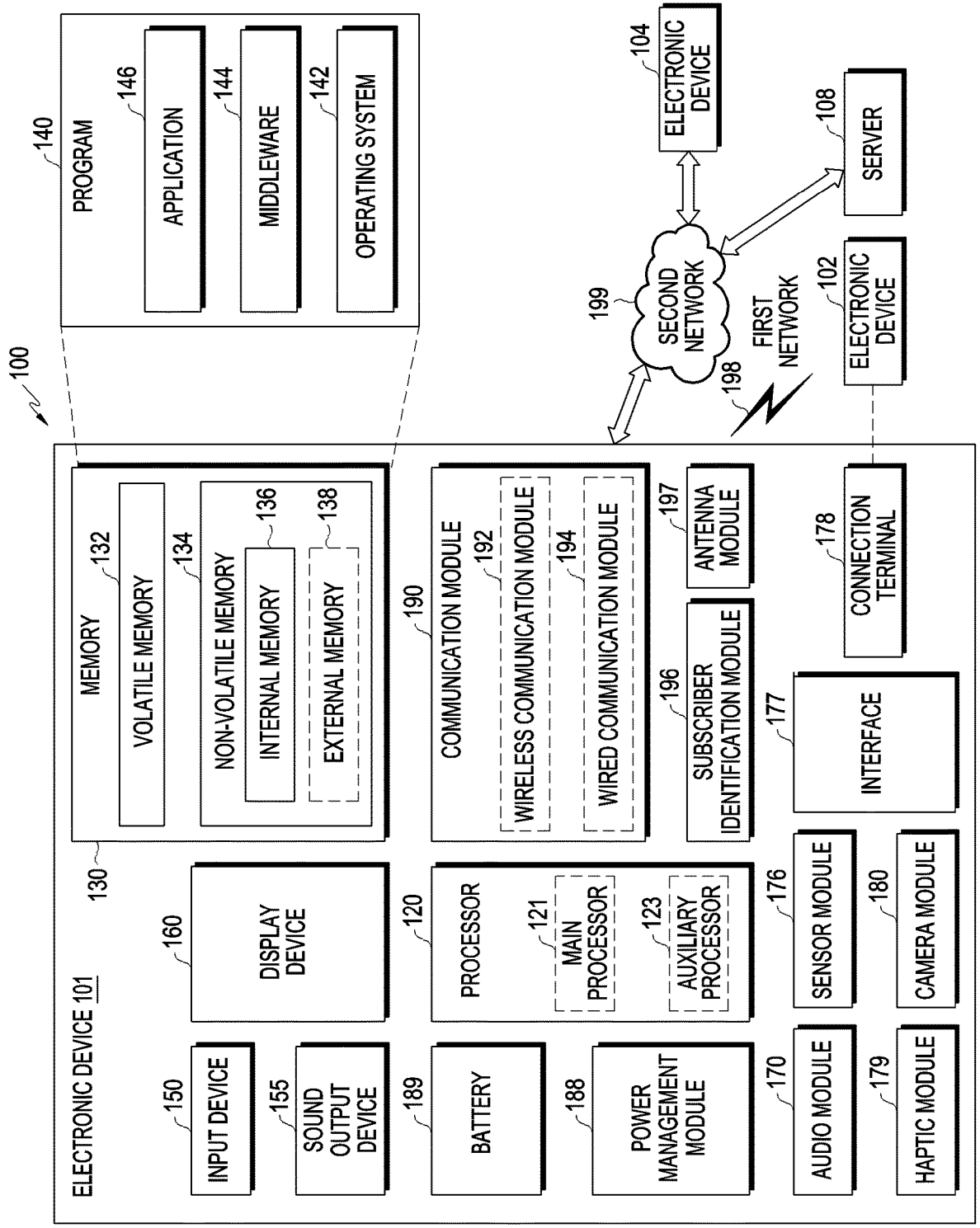
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smailphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
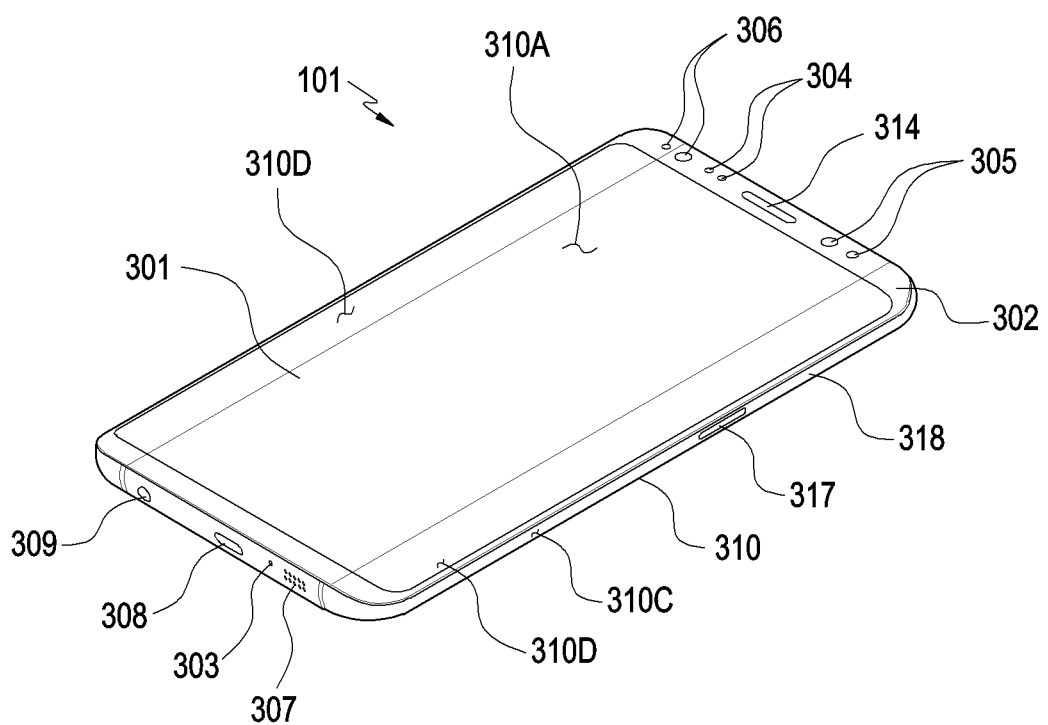
FIG. 2A is a front perspective view illustrating an electronic device according to an embodiment of the disclosure.

FIG. 2A is a front perspective view of an electronic device according to an embodiment of the disclosure.

Figure 2B:
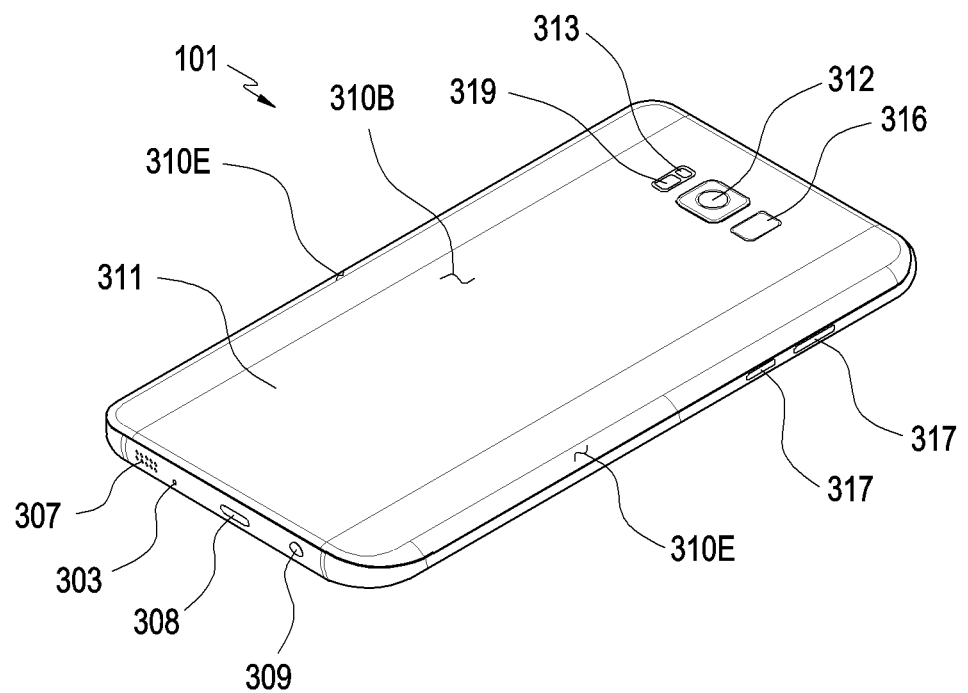
FIG. 2B is a rear perspective view illustrating an electronic device according to an embodiment of the disclosure.

FIG. 2B is a rear perspective view of the electronic device according to an embodiment of the disclosure.

Referring to FIGS. 2A and 2B, the electronic device 101 according to an embodiment may include a housing 310 including a first surface (or a front surface) 310A, a second surface (or a rear surface) 310B, and a side surface 310C surrounding the space between the first surface 310A and the second surface 310B. In another embodiment (not illustrated), the term "housing" may refer to a structure defining a part of the first surface 310A, the second surface 310B, and the side surface 310C in FIG. 2A. According to an embodiment, at least a portion of the first surface 310A may be defined by a substantially transparent front plate 302 (e.g., a glass plate or a polymer plate including various coating layers). The second surface 310B may be defined by a substantially opaque rear plate 311. The rear plate 311 may be made of, for example, coated or colored glass, ceramic, a polymer, a metal (e.g., aluminum, stainless steel (STS), or magnesium), or a combination of two or more of these materials. The side surface 310C may be defined by a side bezel structure 318 (or a "side member") coupled to the front plate 302 and the rear plate 311 and including a metal and/or a polymer. In some embodiments, the rear plate 311 and the side bezel structure 318 may be integrally configured, and may include the same material (e.g., a metal material such as aluminum).

In the illustrated embodiment, the front plate 302 may include, at the long opposite side edges thereof, two first areas 310D, which are bent from the first surface 310A towards the rear plate 311 and extend seamlessly. In the illustrated embodiment (see FIG. 2B), the rear plate 311 may include, at the long opposite side edges thereof, two second areas 310E, which are bent from the second surface 310B towards the front plate 302 and extend seamlessly. In some embodiments, the front plate 302 (or the rear plate 311) may include only one of the first areas 310D (or the second areas 310E). In another embodiment, some of the first areas 310D and the second areas 310E may not be included. In the embodiments described above, when viewed from the side of the electronic device 101, the side bezel structure 318 may have a first thickness (or width) on the side surface portions that do not include the first areas 310D or the second areas 310E, and may have a second thickness, which is smaller than the first thickness, on the side surface portions that include the first areas 310D or the second areas 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or other components may be additionally included in the electronic device 101.

According to an embodiment, the display 301 may be exposed through a substantial portion of, for example, the front plate 302. In some embodiments, at least a portion of the display 301 may be exposed through the front plate 302 defining the first surface 310A and the first areas 310D of the side surface 310C. In some embodiments, the edges of the display 301 may be configured to be substantially the same as the shape of the periphery of the front plate 302 adjacent thereto. In another embodiment (not illustrated), the distance between the periphery of the display 301 and the periphery of the front plate 302 may be substantially constant in order to enlarge the exposed area of the display 301.

In another embodiment (not illustrated), recesses or openings may be configured in some portions of the screen display area of the display 301, and one or more of the audio module 314, the sensor modules 304, the camera modules 305, and the light-emitting elements 306, which are aligned with the recesses or the openings, may be included. In another embodiment (not illustrated), the rear surface of the screen display area of the display 301 may include at least one of the audio modules 314, the sensor modules 304, the camera modules 305, the fingerprint sensor 316, and the light-emitting elements 306. In another embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 304 and 519 and/or at least some of the key input devices 317 may be disposed in the first areas 310D and/or the second areas 310E.

According to an embodiment, the audio modules 303, 307, and 314 may include a microphone hole 303 and speaker holes 307 and 314. The microphone hole 303 may include a microphone disposed therein so as to acquire external sound, and in some embodiments, multiple microphones may be disposed therein so as to enable detection of the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker may be included therein without the speaker holes 307 and 314 (e.g., a piezo speaker).

According to an embodiment, the sensor modules 304, 316, and 319 may generate an electrical signal or a data value corresponding to the internal operating state or an external environmental state of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor) and/or a fourth sensor module 316 (e.g., a fingerprint sensor) disposed on the second surface 310B of the housing 310. The fingerprint sensor may be disposed not only on the first surface 310A of the housing 310 (e.g., the display 301), but also on the second surface 310B. The electronic device 101 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

According to an embodiment, the camera modules 305, 312, and 313 may include, for example, a first camera device 305 disposed on the first surface 310A of the electronic device 101 and a second camera device 312 and/or a flash 313 disposed on the second surface 310B of the electronic device 101. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera, a wide-angle lens, and a telephoto lens), and image sensors may be disposed on one surface of the electronic device 101.

According to an embodiment, the key input devices 317 may be disposed on the side surface 310C of the housing 310. In another embodiment, the electronic device 101 may not include some or all of the above-mentioned key input devices 317, and a key input device 317, which is not included in the electronic device 101, may be implemented in another form, such as a soft key, on the display 301. In some embodiments, a key input device may include a sensor module 316 disposed on the second surface 310B of the housing 310.

According to an embodiment, the light-emitting element 306 may be disposed on, for example, the first surface 310A of the housing 310. The light-emitting elements 306 may provide, for example, information about the state of the electronic device 101 in an optical form. In another embodiment, the light-emitting element 306 may provide a light source that is interlocked with, for example, the operation of the camera module 305. The light-emitting elements 306 may include, for example, an LED, an IR LED, and a xenon lamp.

According to an embodiment, the connector holes 308 and 309 may include a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device.

Figure 3:
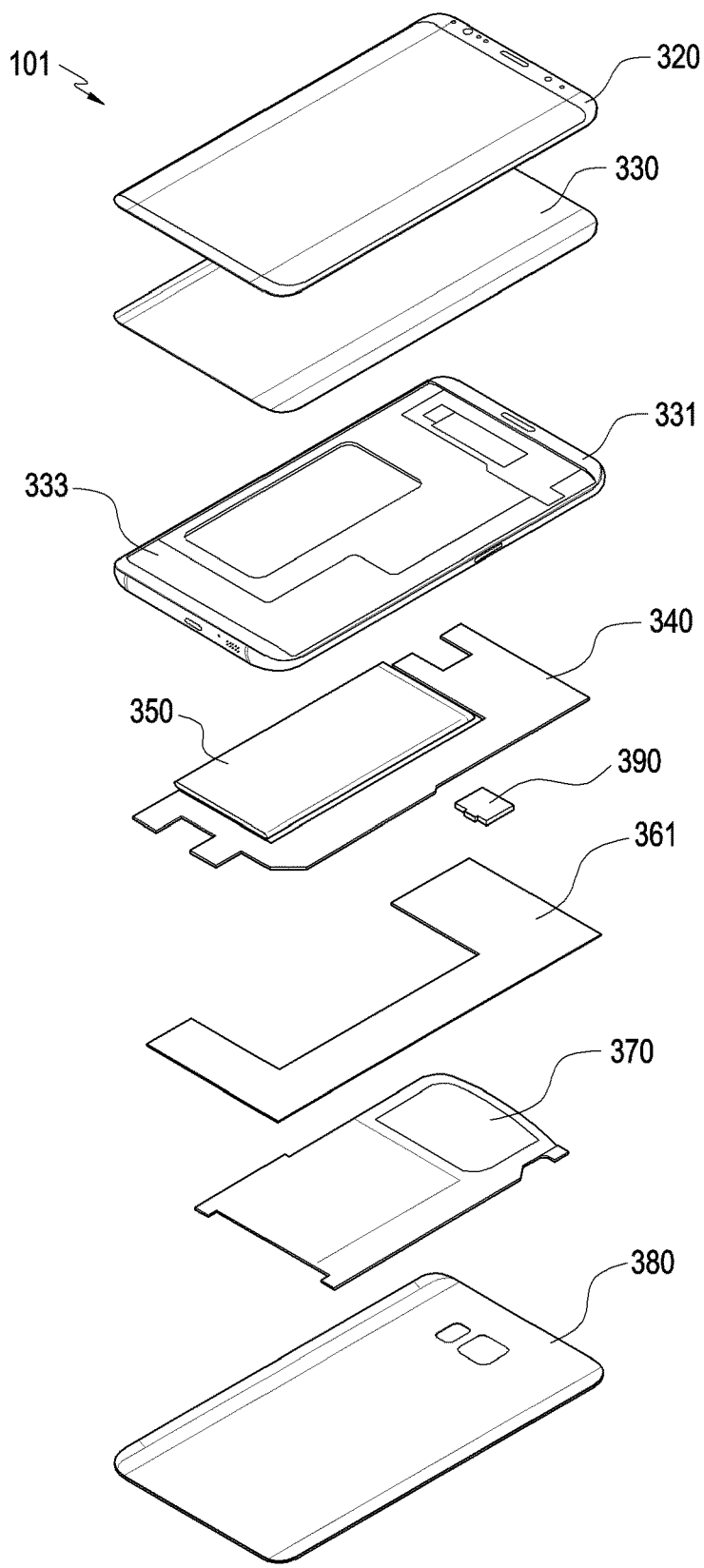
FIG. 3 is an exploded perspective view illustrating an electronic device according to an embodiment of the disclosure.

FIG. 3 is an exploded perspective view illustrating an electronic device according to an embodiment of the disclosure.

Referring to FIG. 3, the electronic device 101 (e.g., the electronic device 101 in FIGS. 1, 2A, and 2B) may include a side bezel structure 331, a first support member 333, a front plate 320, a display 330, a printed circuit board 340, a battery 350, a second support member 361 (e.g., a rear case), an antenna 370, an audio module 390, and a rear plate 380. In some embodiments, at least one of the components (e.g., the first support member 333 or the second support member 361) may be omitted from the electronic device 101, or other components may be additionally included in the electronic device 101. At least one of the components of the electronic device 101 may be the same as or similar to at least one of the components of the electronic device 101 of FIG. 2A or 2B, and a redundant description thereof is omitted below.

According to an embodiment, the first support member 333 may be disposed inside the electronic device 101 so as to be connected to the side bezel structure 331, or may be integrally configured with the side bezel structure 331. The first support member 333 may be made of, for example, a metal material and/or a non-metal material (e.g., a polymer). The display 330 may be coupled to one surface of the first support member 333, and the printed circuit board 340 may be coupled to the other surface of the first support member 333. On the printed circuit board 340, a processor, a memory, and/or an interface may be mounted. The processor may include at least one of, for example, a central processing unit, an application processor, a graphics processor, an image signal processor, a sensor hub processor, or a communication processor.

According to an embodiment, the memory may include, for example, a volatile memory or a nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/MMC connector, or an audio connector.

According to an embodiment, the battery 350 is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

According to an embodiment, the antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by a portion of the side bezel structure 331, a portion of the first support member 333, or a combination thereof.

According to an embodiment, the audio module 390 may bidirectionally convert sound and electrical signals. According to an embodiment, the audio module 390 may include a microphone mounted inside the electronic device 101 to acquire external sound, and a speaker mounted inside the electronic device 101 to output sound to the outside. The microphone may acquire sound through a microphone hole (the microphone hole 303 in FIG. 2A), and the speaker may output sound through a speaker hole (the speaker holes 307 and 314 in FIG. 2A).

Figure 4:
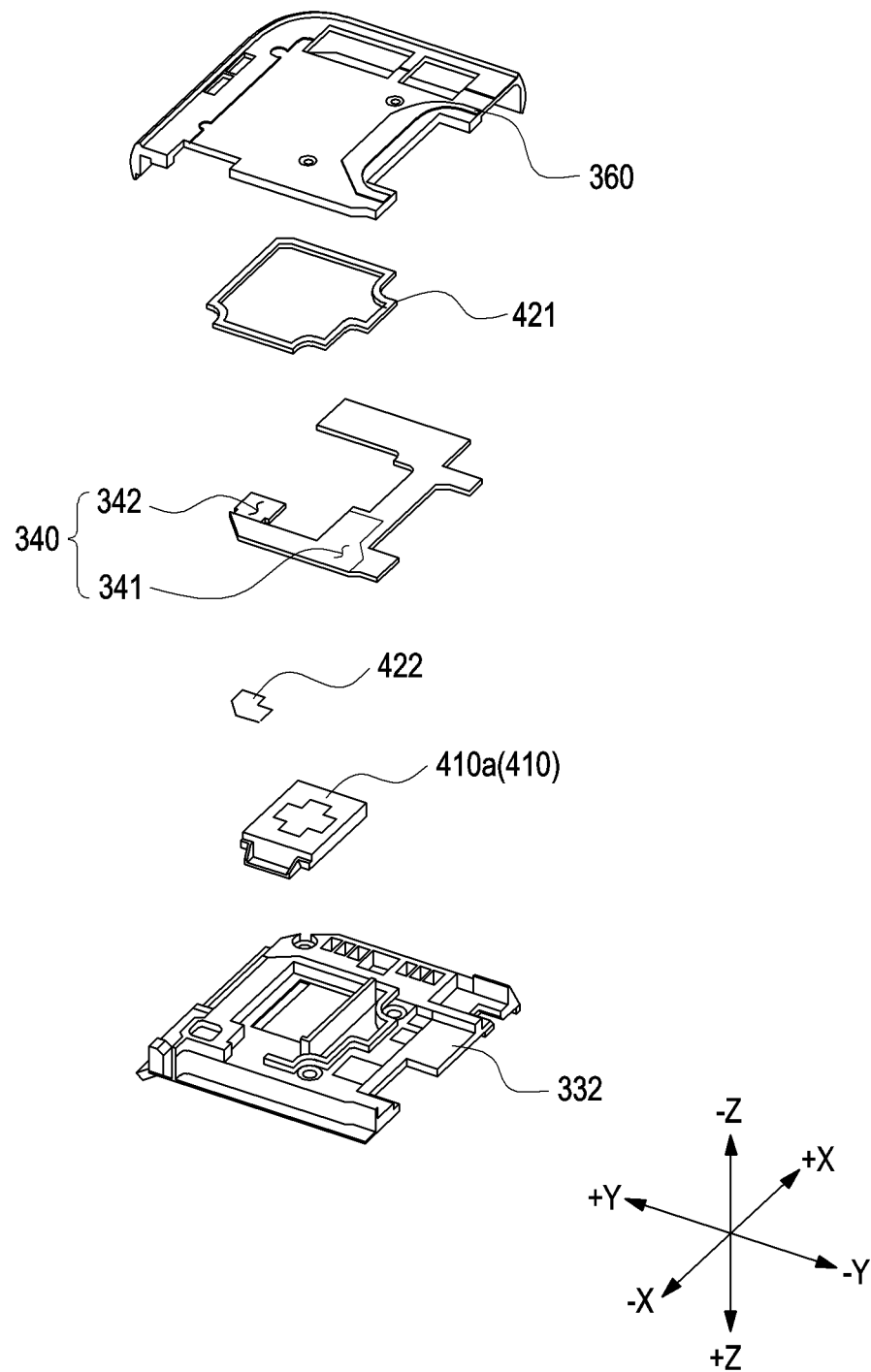
FIG. 4 is an exploded perspective view illustrating a speaker module mounting structure, which is disposed on one side of an electronic in a separated state according to an embodiment of the disclosure.

FIG. 4 is an exploded perspective view illustrating a speaker module mounting structure, which is disposed on one side of an electronic device in a separated state according to an embodiment of the disclosure.

Figure 5A:
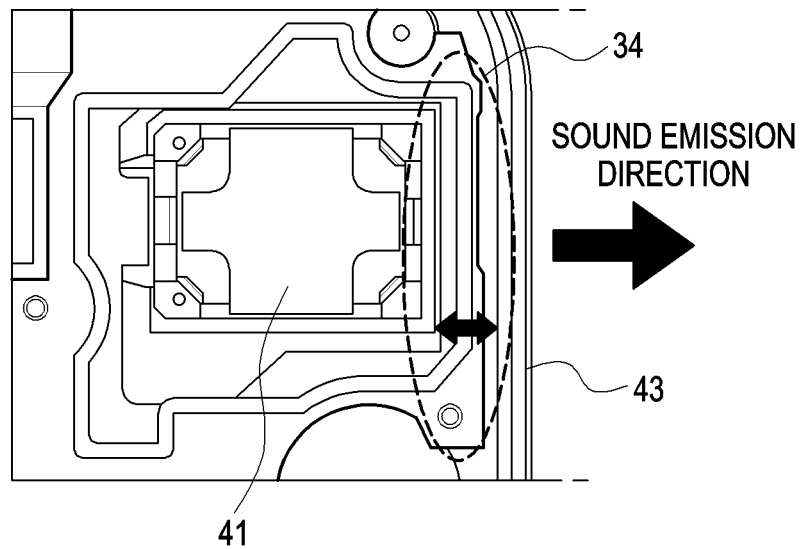
FIG. 5A is a view illustrating a general speaker module mounting structure according to an embodiment of the disclosure.

FIG. 5A is a view illustrating a general speaker module mounting structure according to an embodiment of the disclosure.

Figure 5B:
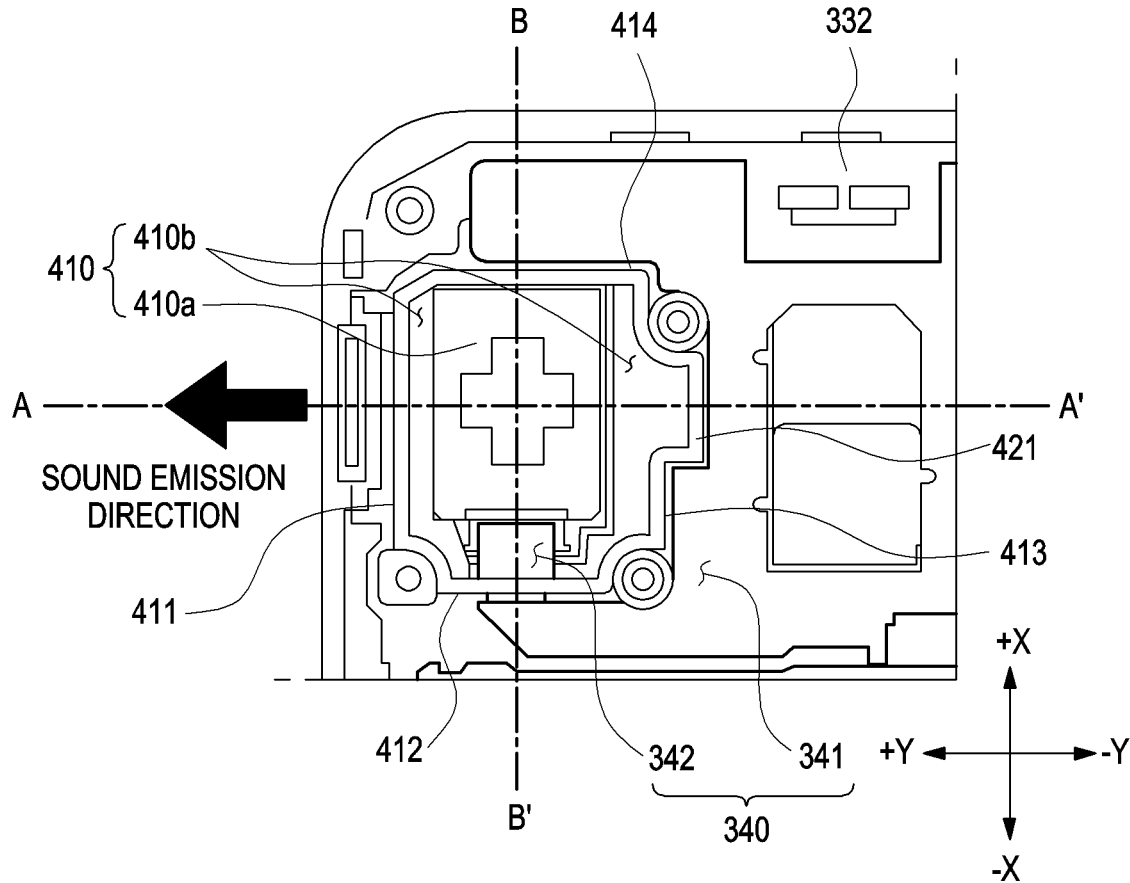
FIG. 5B is a rear view illustrating a speaker module mounting structure, which is disposed on one side of an electronic device according to an embodiment of the disclosure.

FIG. 5B is a rear view illustrating a speaker module mounting structure, which is disposed on one side of an electronic device according to an embodiment of the disclosure.

Referring to FIGS. 4 and 5B, a speaker module may be a separate carrier including a speaker, and as another example, the speaker module may be provided in a structure that blocks the rear sound of the speaker such as a plate and/or a bracket together with the carrier.

According to various embodiments, the electronic device (e.g., the electronic device 101 of FIGS. 1, 2A, 2B, and 3) may include a speaker module mounting structure disposed in the housing (e.g., the housing 310 in FIGS. 2A and 2B). The speaker module mounting structure may include a speaker module 410, a plate 360 and a bracket 332 of the housing 310 that provide an inner space in which the speaker module 410 is disposed, and a printed circuit board 340 electrically connected to at least a portion of the speaker module 410. As another example, the mounting structure may include a first sealing member 421 disposed between the plate 360 and the bracket 332 so as to define a resonance space 410b of the speaker module 410. As another example, the mounting structure may include a gasket (e.g., the gasket 460 in FIG. 6A) disposed on a conduit (e.g., the conduit 480 in FIG. 6A) facing the outside from the speaker module 410. The speaker module 410 may include a speaker component 410a in the form of an integrated circuit chip and the resonance space 410b.

The configuration of the plate 360, the bracket 332, and the speaker component 410a of the mounting structure of FIGS. 4 and 5B may be partially or entirely the same as the configuration of the rear plate 380, the side bezel structure 331, the first support member 333, and the audio module 390 of FIG. 3.

Referring to FIGS. 4 and 5B, "X" in an orthogonal coordinate system of two or three axes may mean the length direction of the electronic device 101, "Y" may mean the width direction of the electronic device 101, "Z" may mean the thickness direction of the electronic device 101. In addition, in an embodiment of the disclosure, "Z" may mean a first direction (a +Z-axis direction) or a second direction (a −Z-axis direction), "X" may mean a +X-axis direction or a −X-axis direction, and "Y" may mean a +Y-axis direction or a −Y-axis direction.

According to various embodiments, the speaker component 410a may be disposed in an inner space defined by coupling a plate 360 of the housing 310 disposed to face the second direction (the −Z-axis direction) and a bracket 332 disposed to face the first direction (the +Z-axis direction) opposite to the second direction (the −Z axis direction). In the inner space, a space other than that accommodating the speaker component 410a may be utilized as the resonance space 410b of the speaker module 410.

According to various embodiments, the bracket 332 and the plate 360 are disposed so as to at least partially face each other, and it is possible to provide a seating space in which the speaker component 410a is capable of being seated and the resonance space 410 due to a rib structure of the bracket 332 facing the second direction (the −Z-axis direction) and a rib structure of the plate 360 facing the first direction (the +Z-axis direction). With respect to the speaker component 410a, the resonance space 410b may include a first portion (e.g., the first portion S1 in FIG. 6A) facing the third direction (the +Y-axis direction) and a second portion (e.g., the second portion S2 in FIG. 6A) facing the fourth direction (the −Y-axis direction), and the first portion S1 and the second portion S2 may be partitioned from each other. One side of the first part S1 and/or the second part S2 is a space defined by coupling the plate 360 and one surface of the speaker component 410a, and a sealing member (e.g., the third sealing member 423) may be disposed along the joint portion between the plate 360 and the speaker component 410a. The third sealing member 423 is capable of blocking sound waves in the resonance space of each of the first and second parts S1 and S2 from leaking to the outside. The other side of the first portion S1 and/or the second portion S2 is a space defined by coupling the plate 360 and the other surface of the speaker component 410a of the bracket 332, and a sealing member (e.g., the first sealing member 421) may be disposed along the joint portion between the plate 360 and the bracket 332 to prevent leakage of sound waves in the inner space to a path other than a predetermined section or to prevent inflow of foreign matter including fluids or the like. The sealing member may be made of a material that is sealed or bonded via, for example, a gasket and/or adhesive tape.

According to an embodiment, a portion of the bracket 332 may define a conduit 480 extending to the outside of the electronic device 101. As another example, a portion of the bracket 332 may extend to the outside of the electronic device 101 so as to define a conduit 480 coupled to the plate 360. The conduit 480 is capable of providing a ventilation function between the conduit and the outside of the electronic device 101 and a passage function through which the sound of the speaker is propagated to the outside.

According to various embodiments, a printed circuit board 340 may be disposed in the inner space between the plate 360 and the bracket 332. On the printed circuit board 340, a processor, a communication module, or the like may be mounted in the form of an integrated circuit chip. The printed circuit board 340 may have a shape one side of which is open and may be disposed to surround the edge of at least a portion of the speaker component 410a.

According to an embodiment, the speaker module 410 may include a speaker component 410a provided in a substantially hexahedral shape, and a resonance space 410b surrounding the periphery of the speaker component 410a. The edges of the resonance space 410b corresponding to a side surfaces of the speaker module 410 may include a first side surface 411, a second side surface 412, a third side surface 413, and a fourth side surface 414, which have a predetermined thickness. For example, the first side surface 411 may be disposed to face the +Y-axis direction, the second side surface 412 may be disposed to face the −X-axis direction, the third side surface 413 may be disposed to face the −Y-axis direction, and the fourth side surface 414 may be disposed to face the +X-axis direction.

According to an embodiment, the printed circuit board 340 may be configured to open at least a portion of the first side surface 411 of the speaker component 410a, and may be manufactured in a shape that surrounds the second side surface 412, the third side surface 413, and the fourth side surface 414. The first side surface 411 may be disposed adjacent to an edge of the electronic device 101, and the conduit 480 configured to guide sound emission may be disposed in a direction the first side surface 411 faces. According to an embodiment, the printed circuit board 340, from which one side (e.g., the portion facing the first side surface 411 of the speaker component 410a) is removed, may allow the speaker component 410a to be disposed closer to the edge of the electronic device 101 compared with a typical printed circuit board manufactured in the form of a closed loop illustrated in FIG. 5A. For example, in the general printed circuit board 34 of FIG. 5A, one area of the printed circuit board 34 is disposed between the speaker component 41 and the sound emission hole 43. Thus, the speaker component is disposed in the state of being moved away from the sound emission hole 43 by the width of the one area, which may lead to an increase in the length of the conduit. The increase in the length of the conduit may cause deterioration in a low-frequency band performance due to a decrease in the resonance section. As another example, the total volume of the speaker component 41 or the speaker module may increase by the width of the one area, which may lead to the reduction of the mounting space inside the electronic device. In the printed circuit board 340 according to the embodiment of the disclosure, since the printed circuit board is not disposed between the speaker component 410a and the sound emission hole, which may lead to the reduction of the length of the conduit guiding the sound emission and the increase of the size of the conduit.

According to an embodiment, the printed circuit board 340 is disposed on the side surface of the speaker component 410a, and may include a first area 341 disposed adjacent to the speaker module 410 and a second area 342 inserted into and disposed in the speaker module 410. For example, the printed circuit board 340 may be manufactured in a cantilever shape, and may be provided such that an end portion of the second area 342 is fixed, and the remaining portion is in a free form.

According to an embodiment, the first area 341 of the printed circuit board 340 may be located in an area other than the resonance space 410b surrounding the speaker component 410a, and may be disposed so as not to overlap the first sealing member 421. For example, the first area 341 may be disposed to be spaced apart from the second side surface 412, the third side surface 413, and the fourth side surface 414 that define the side surface of the speaker component 410a. The second area 342 of the printed circuit board 340 may be located in the resonance space 410b, and may be disposed so as to overlap the first sealing member 421. For example, the second area 342 extends to one surface of the speaker component 410a (e.g., the second side surface 412), and may define a contact with the speaker component 410a to provide electrical flow. As the second area 342 is inserted into and disposed in the resonance space 410b, a separate sealing member may be disposed on the front surface, the rear surface, or the side surface of the second area 342 to seal the resonance space 410b (e.g., the second sealing member (the second sealing member 422 in FIG. 7B)). According to the disclosure, the printed circuit board 340 disposed in the resonance space 410b is designed to be limited to the second area 342 extending inside the second side surface 412 of the speaker component 410a. Thus, since the volume of the resonance space 410b is substantially enlarged, it is possible to improve the performance of the speaker module 410, and to increase the mounting area of the printed circuit board 340. According to an embodiment of the disclosure, the portion of the printed circuit board 340 inserted into the resonance space 410b to be connected to the speaker component 410a has been described only with the second area 342 which extends into the second side surface 412 of the speaker component 410a, but is not limited thereto. Depending on the design of the printed circuit board 340 and the structure of the inner space, a partial area of the printed circuit board 340 may be disposed in the resonance space 410b, and additional sealing may be required.

According to various embodiments, a sealing member 421, 422, or 423 may be disposed between the plate 360 and the bracket 332 so as to seal the inner space. The inner space may include a space in which the speaker component 410a is mounted and a resonance space 410b. A plurality of the sealing members 421, 422, or 423 may be disposed depending on a position. For example, a first sealing member 421 may be disposed to surround the entire area of the inner space in a closed loop shape. As another example, the first sealing member 421 may be provided in a shape corresponding to the side surface of the speaker component 410*a*. The first sealing member 421 may be provided in various shapes including a curved portion corresponding to the shape of the inner space. As another example, a second sealing member 422 may be provided to seal the periphery of the second area 342 of the printed circuit board 340 inserted into the resonance space 410*b*. Together with the first sealing member 421 which covers a partial surface of the second area 342, the second sealing member 422 may cover the other surface of the second area 342 so as to block leakage of sound waves in the resonance space 410*b* to a path other than a predetermined section, and to seal the other surface so as to prevent inflow of foreign matter including fluids or the like.

Figure 6A:
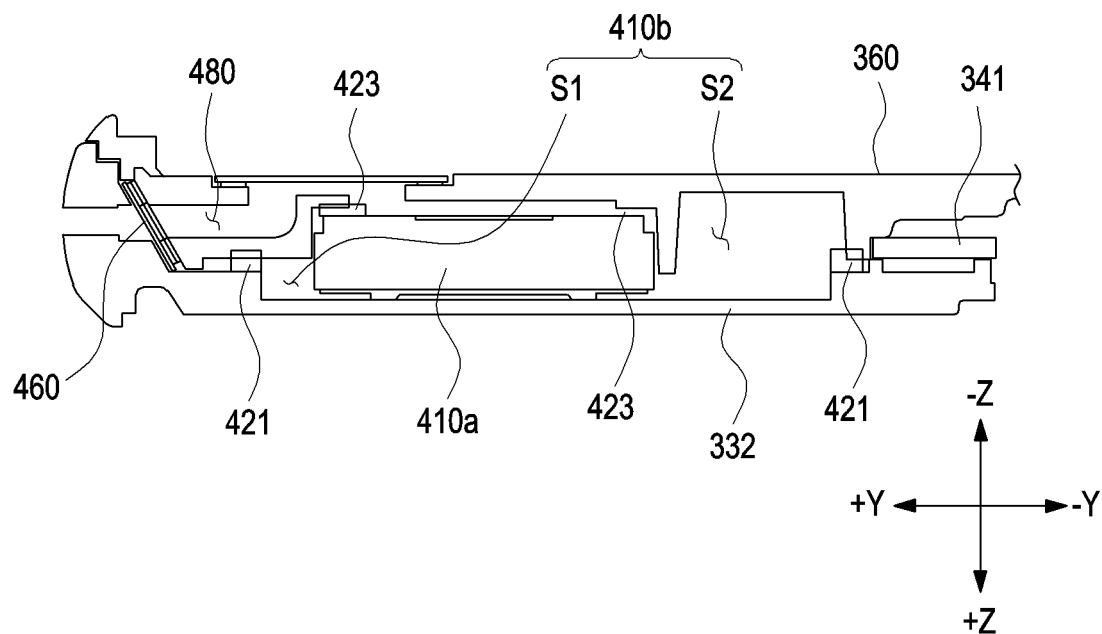
FIG. 6A is a cross-sectional view of the mounting structure of FIG. 5B, which is taken along line A-A' according to an embodiment of the disclosure.

FIG. 6A is a cross-sectional view of the mounting structure of FIG. 5B, which is taken along direction A-A' according to an embodiment of the disclosure.

Figure 6B:
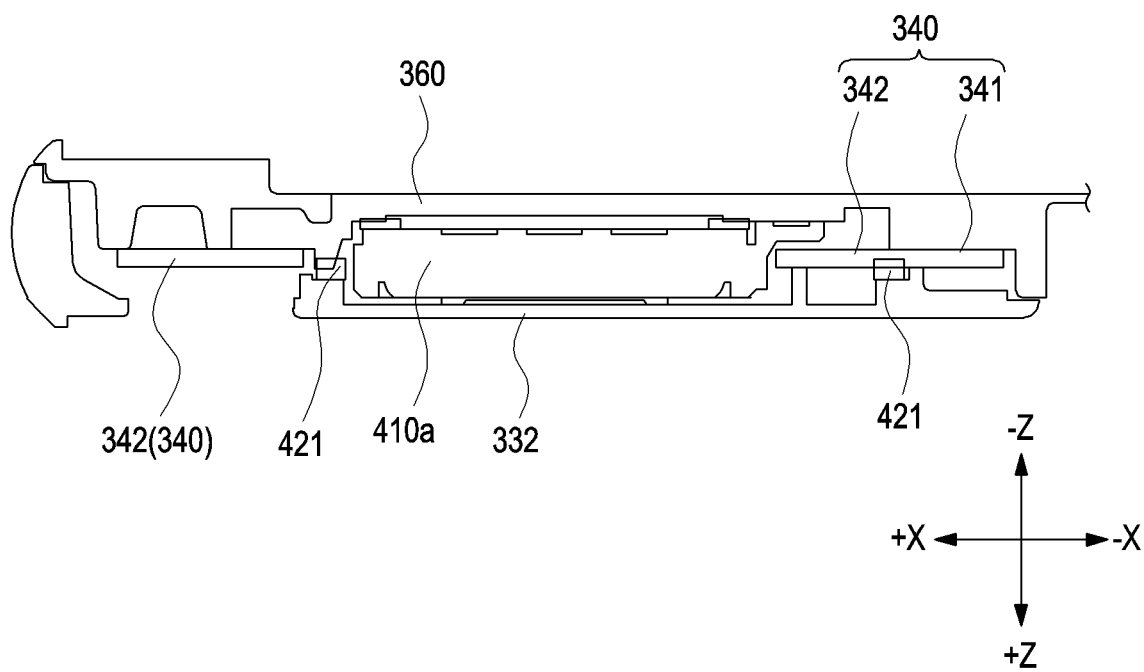
FIG. 6B is a cross-sectional view of the mounting structure of FIG. 5B, which is taken along direction B-B' according to an embodiment of the disclosure.

FIG. 6B is a cross-sectional view of the mounting structure of FIG. 5B, which is taken along direction B-B' according to an embodiment of the disclosure.

Referring to FIGS. 6A and 6B, "X" in an orthogonal coordinate system of two axes may mean the length direction of the electronic device 101 (e.g., the electronic device 101 in FIGS. 1, 2A, 2B, and 3), "Y" may mean the width direction of the electronic device 101, and "Z" may mean the thickness direction of the electronic device 101. In addition, in an embodiment of the disclosure, "Z" may mean a first direction (a +Z-axis direction) or a second direction (a −Z-axis direction), "X" may mean a +X-axis direction or a −X-axis direction, and "Y" may mean a +Y-axis direction or a −Y-axis direction.

Referring to FIGS. 6A and 6B, in the electronic device (e.g., the electronic device 101 of FIGS. 1, 2A, 2B, and 3), a speaker module 410 and a bracket 332 may be sequentially disposed from an upper plate 360 toward the first direction (the +Z-axis direction). As another example, a printed circuit board 340 and at least one sealing member 421 or 422 may be disposed on the side surface of the speaker module 410.

The structure of the speaker module (e.g., a speaker component 410*a* and a resonance space 410*b*), the plate 360, the bracket 332, and the printed circuit board 340 of FIGS. 6A and 6B may be partially or entirely the same as the structure of the speaker module (e.g., the speaker component 410*a* and the resonance space 410*b*), the plate 360, the bracket 332, and the printed circuit board 340 of FIGS. 4 and 5B.

According to various embodiments, the plate 360 and the bracket 332 are coupled to each other to define an inner space, and the speaker component 410*a* is disposed in the inner space, and the resonance space 410*b* is defined around the speaker component 410*a*.

According to an embodiment, the first portion S1 of the resonance space 410*b* configured in the first direction (the +Z-axis direction) of the speaker component 410*a* may be sealed by the first sealing member 421 disposed in the form of a closed curve between the plate 360 and the bracket 332. The second portion S2 of the resonance space 410*b* configured in the second direction (the −Z-axis direction) of the speaker component 410*a* may be sealed by a separate sealing member (e.g., the third sealing member 423) between one surface of the speaker component 410*a* facing the second direction (the −Z-axis direction) and the plate 360.

Referring to FIG. 6A, the second portion S2 may extend to a conduit 480 defined outside the electronic device 101, and a gasket 460 may be disposed on the conduit 480. The gasket 460 may include an opening through which air passes, and may be disposed between the plate 360 and the bracket 332 to provide a passage connected to the outside when a water pressure is not provided. The conduit 480 may guide the sound generated by the speaker module 410 to be provided to the outside. According to an embodiment, the first area 341 of the printed circuit board 340 may be spaced apart by a predetermined distance from the speaker component 410*a* so as to be located outside the resonance space 410*b*.

Referring to FIG. 6B, the second area 342 of the printed circuit board 340 may extend from the first area 341 into the resonance space 410*b*. The second area 342 extending into the resonance space 410*b* may be connected to at least a portion of the speaker component 410*a* (e.g., the pin 415 in FIG. 7A) to configure an electrical contact.

Figure 7A:
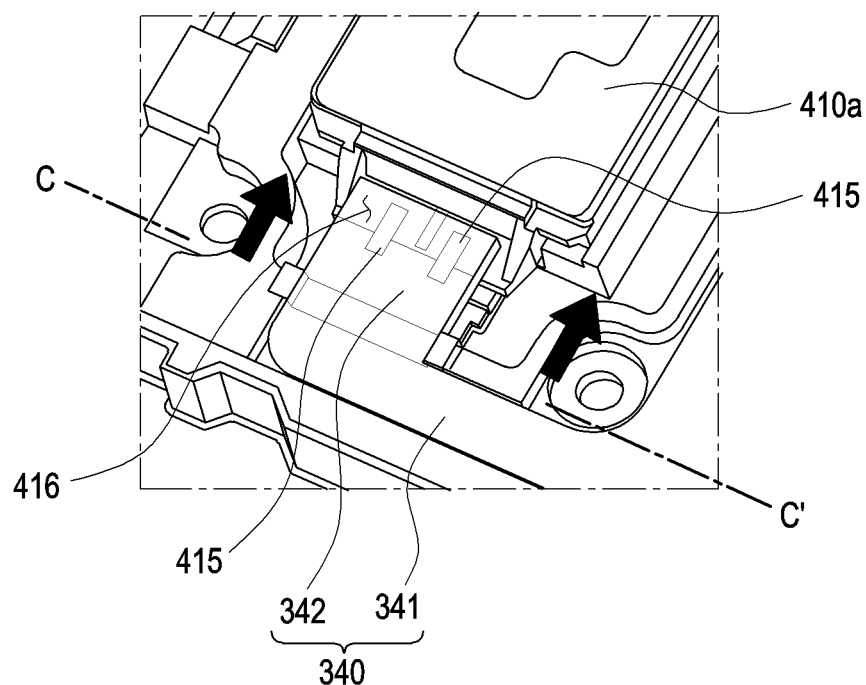
FIG. 7A is a perspective view illustrating a connection relationship between a speaker component and a partial area of a printed circuit board according to an embodiment of the disclosure.

FIG. 7A is a perspective view illustrating a connection relationship between the speaker component and a partial area of a printed circuit board according to an embodiment of the disclosure.

Figure 7B:
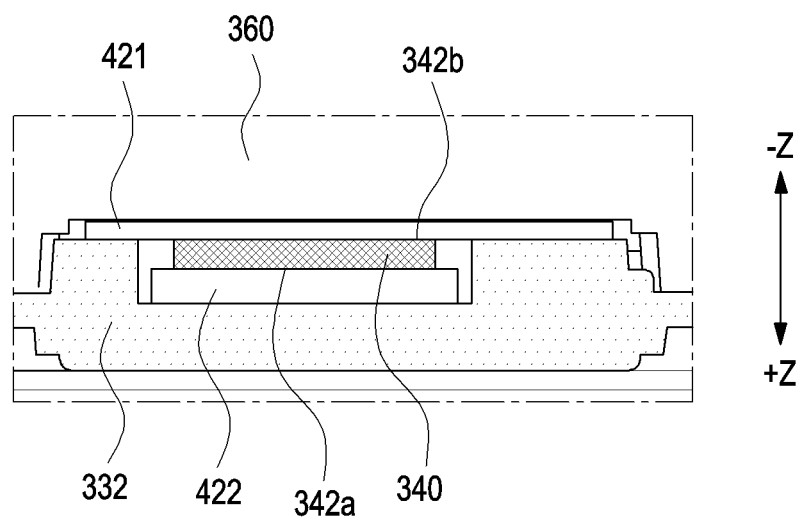
FIG. 7B is a cross-sectional view of the printed circuit board arrangement area of FIG. 7A taken along direction C-C' according to an embodiment of the disclosure.

FIG. 7B is a cross-sectional view of the printed circuit board arrangement area of FIG. 7A taken along direction C-C' according to an embodiment of the disclosure.

Referring to FIGS. 7A and 7B, the speaker module mounting structure may include a plate 360, a bracket 332, a speaker module 410, a first sealing member 421, and a printed circuit board 340. The structure of the speaker module (e.g., a speaker component 410*a* and a resonance space 410*b*), the plate 360, the bracket 332, the printed circuit board 340, and the sealing member 421 or 422 of FIGS. 7A and 7B may be partially or entirely the same as the structure of the speaker module (e.g., the speaker component 410*a* and the resonance space 410*b*), the plate 410*b*, the bracket 332, the printed circuit board 340, and the sealing member 421 or 422 of FIGS. 4, 5A, 5B, 6A, and 6B.

Referring to FIG. 7A, the side surface of the speaker component 410*a* may have a predetermined thickness, and may be seated on a seating portion of the bracket 332. At least one pin 415 and a pad 416 may be disposed on the side surface of the speaker component 410*a* to be electrically connected to the second area 342 of the printed circuit board 340. For example, the side surface may be disposed so as not to face the outside and may extend from an opening of the speaker component 410*a* that is open to the inside of the speaker component 410*a*, and the pad 416 may be disposed outside the speaker component 410*a* or on the upper portion of the bracket 332 and a pair of pins 415 may be disposed on the pad 416. The pad 416 provides an area on which an end of the second area 342 of the printed circuit board 340 is seated, and the pair of pins 415 may provide electrical contacts between the printed circuit board 340 and the speaker component 410*a*.

According to various embodiments, the printed circuit board 340 may be disposed on the side surface of the speaker component 410*a*, and may include a first area 341 disposed adjacent to the speaker module 410 and a second area 342 disposed in the speaker module 410. Referring to FIG. 7B, the second area 342 of the printed circuit board 340 may include a separate mounting structure as a structure inserted into the resonance space 410*b*.

On the mounting structure, the first sealing member 421, a second area 342 of the printed circuit board 340, the second sealing member 422, and the bracket 332 may be sequentially disposed from the upper plate 360 toward the first direction (the +Z-axis direction). For example, the mounting structure may be provided as the first sealing member 421 and the second sealing member 422 surrounding the periphery of the second area 342 of the printed circuit board 340 seated in a recess defined in the bracket 332.

According to an embodiment, the second sealing member 422 may be disposed in the recess of the bracket 332, and the second area 342 of the printed circuit board 340 may be disposed on one surface of the second sealing member 422. For example, the first surface 342a of the second area 342 facing the first direction (the +Z-axis direction) and at least a portion of the second sealing member 422 may be disposed so as to be in contact with each other so that the first surface 342a can be covered. The second sealing member 422 may not extend to the side surface of the second area 342 due to a design tolerance, so a predetermined gap may be provided between the second area 342 and the bracket 332. As another example, the second sealing member 422 may include a groove provided in a shape corresponding to the shape of the second area 342. The groove may entirely cover the first surface 342a and the side surface of the second area 342.

According to an embodiment, the first sealing member 421 may be disposed between the plate 360 and the second area 342 of the printed circuit board 340 so as to be in contact with the second surface 342b of the second area 342 facing the second direction (the −Z-axis direction). The second sealing member 422 may overlap the second surface 342b to substantially entirely cover the second surface 342b.

According to an embodiment, the sealing member 421 or 422 may include an elastic material, such as sponge, rubber, poron, or tape that elastically surrounds the second area 342. For example, the first sealing member 421 may be provided using sponge, and the second sealing member 422 may be provided using rubber.

According to an embodiment of the disclosure, the mounting structure configured to seal the second area 342 of the printed circuit board 340 inserted into and disposed in the resonance space 410b is capable of sealing the periphery of the second area 342, thereby blocking leakage of sound waves in the resonance space 410b to a path other than a predetermined section. In addition, an area other than the second area 342 of the printed circuit board 340 may be designed so as not to overlap the resonance space 410b. Accordingly, by maintaining the contact between the printed circuit board 340 and the speaker module 410 to a minimum, it is possible to provide an effect of expanding the resonance space 410b and to enlarge the mounting space for the printed circuit board 340.

Figure 8:
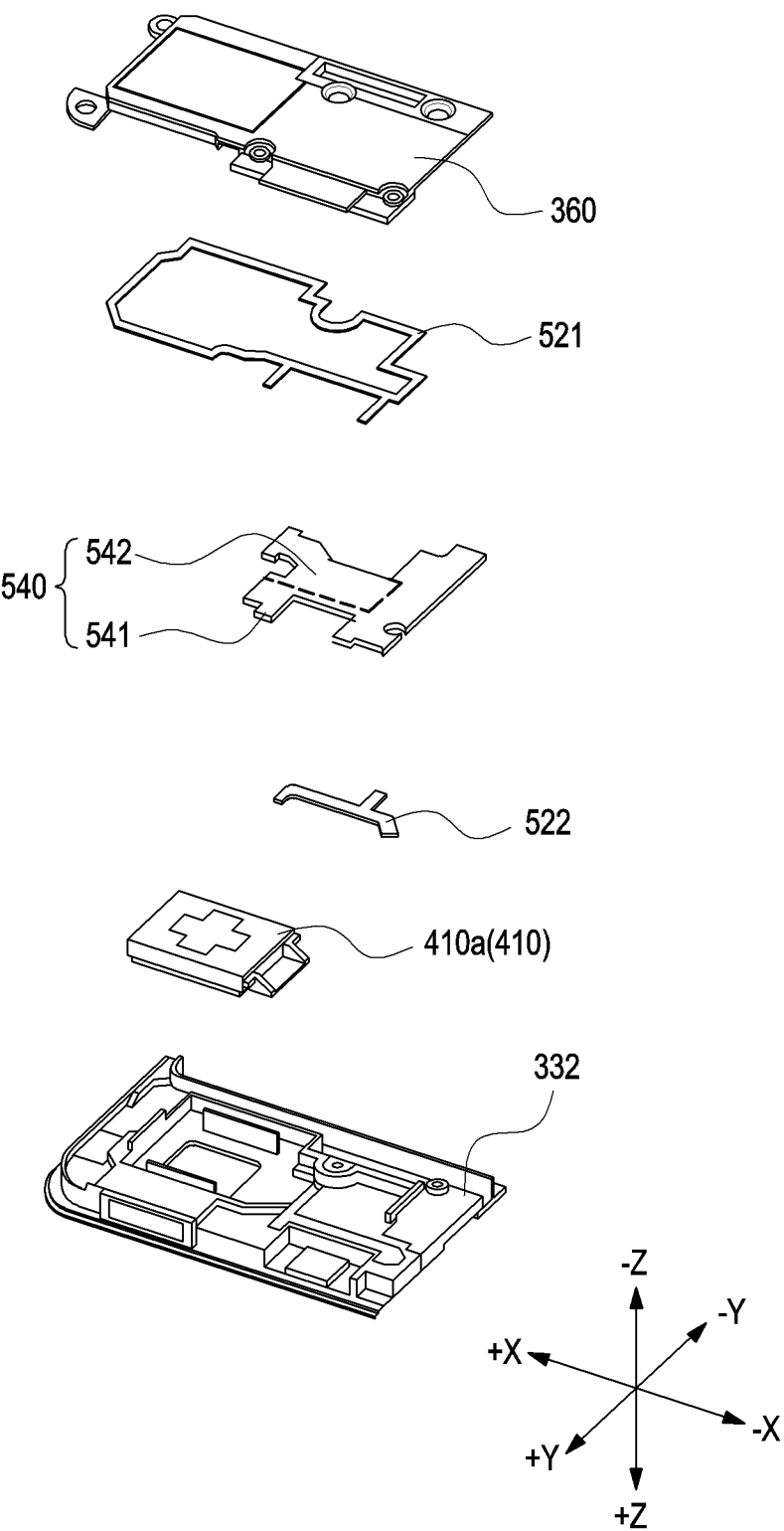
FIG. 8 is an exploded perspective view illustrating a speaker module mounting structure, which is disposed on one side of an electronic device in a separated state according to an embodiment of the disclosure.

FIG. 8 is an exploded perspective view illustrating a speaker module mounting structure, which is disposed on one side of an electronic device in a separated state according to an embodiment of the disclosure.

Figure 9:
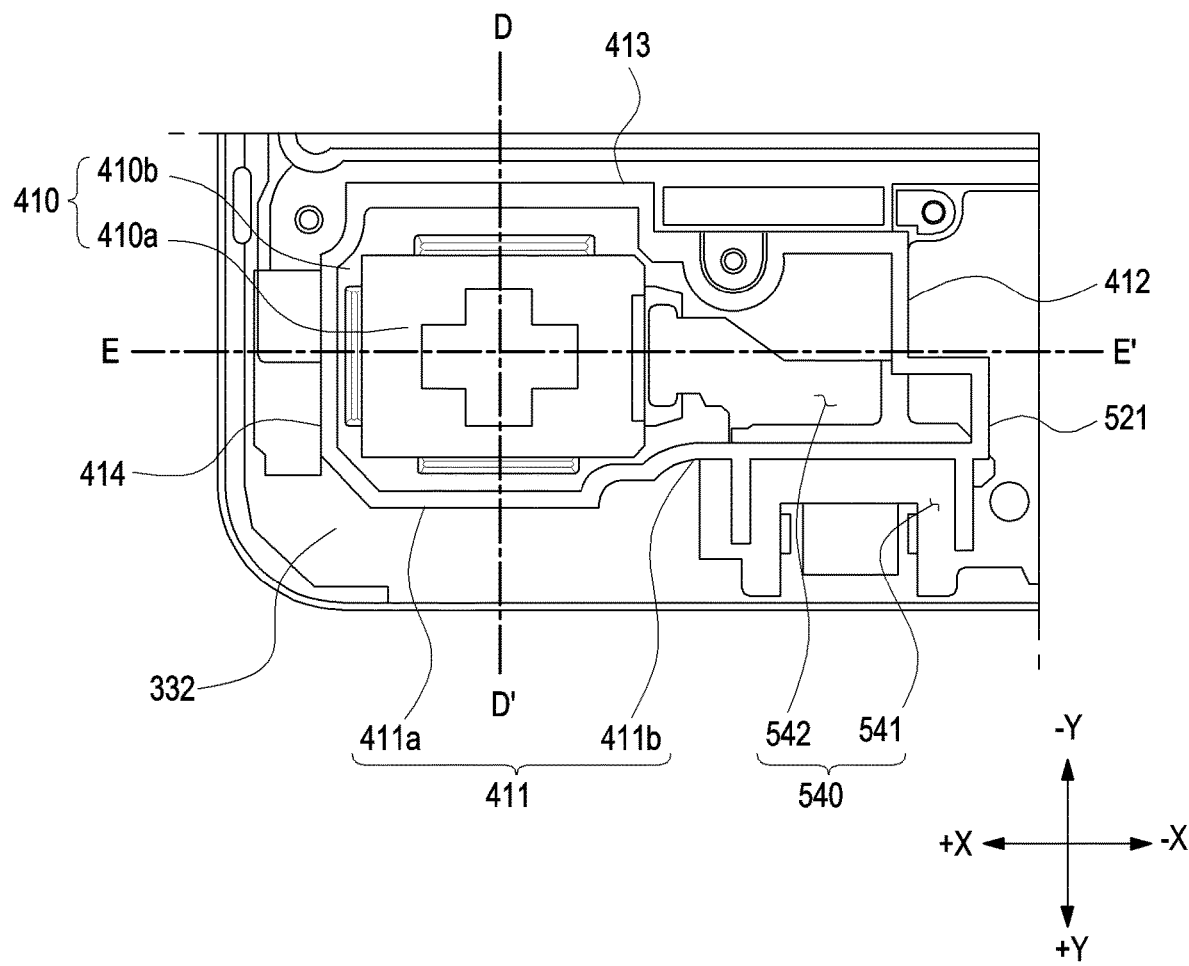
FIG. 9 is a rear view illustrating a speaker module mounting structure, which is disposed on one side of an electronic device according to an embodiment of the disclosure.

FIG. 9 is a rear view illustrating a speaker module mounting structure, which is disposed on one side of an electronic device according to an embodiment of the disclosure.

Figure 10A:
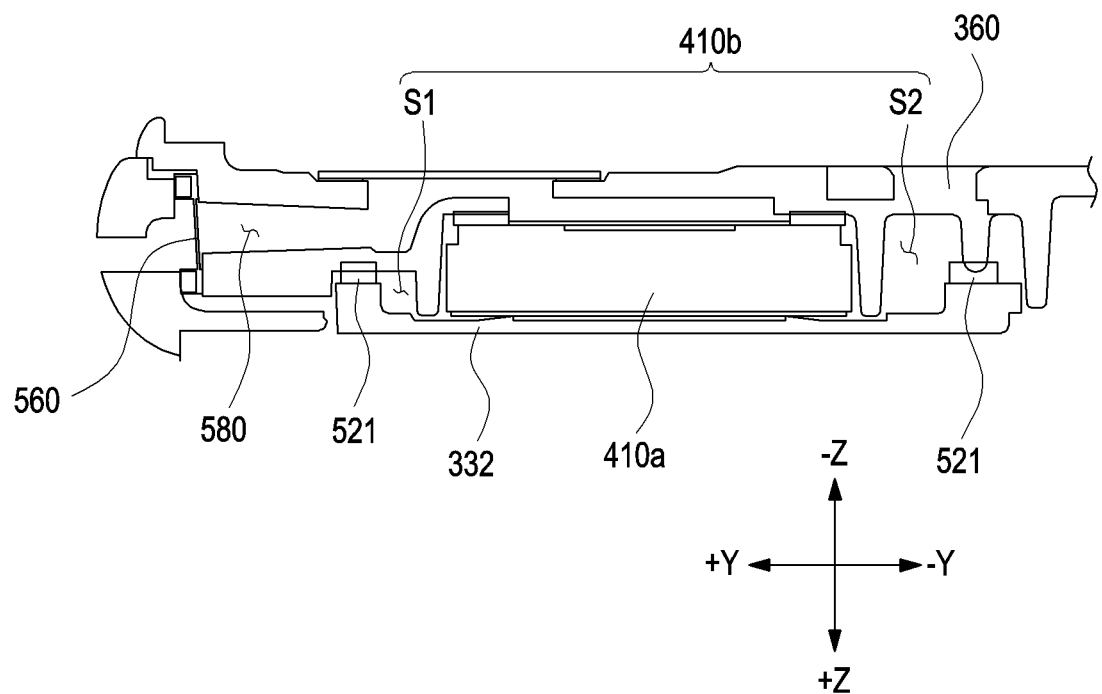
FIG. 10A is a cross-sectional view of the mounting structure of FIG. 9, which is taken along direction D-D' according to an embodiment of the disclosure.

FIG. 10A is a cross-sectional view of the mounting structure of FIG. 9, which is taken along direction D-D' according to an embodiment of the disclosure.

Figure 10B:
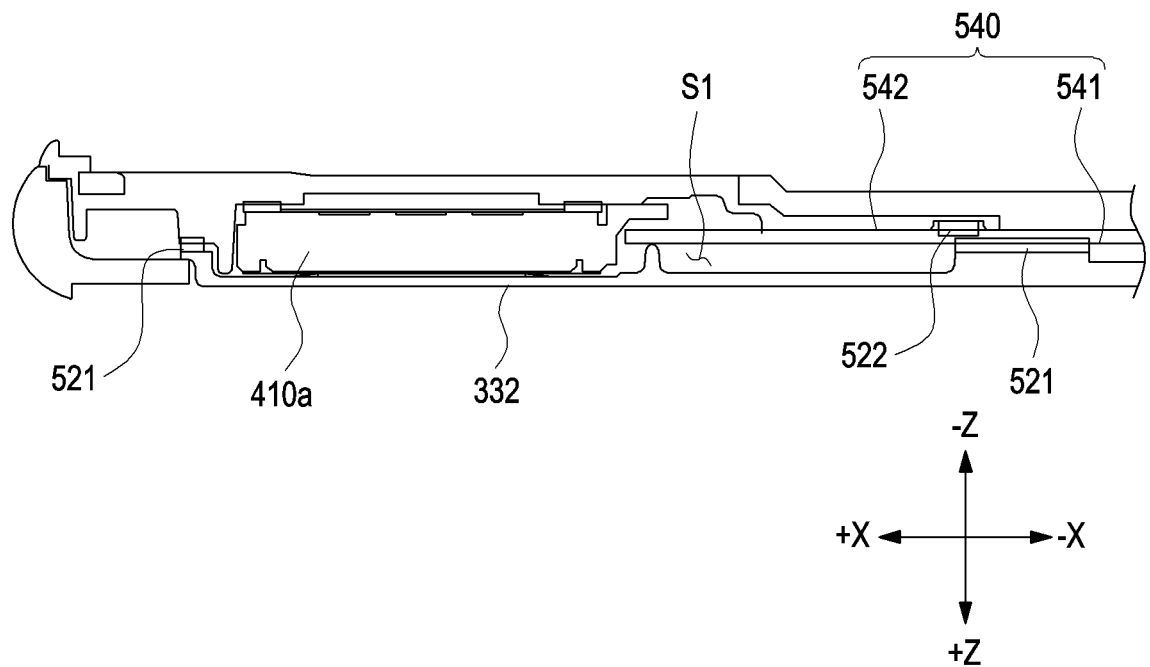
FIG. 10B is a cross-sectional view of the mounting structure of FIG. 10B, which is taken along direction E-E' according to an embodiment of the disclosure.

FIG. 10B is a cross-sectional view of the mounting structure of FIG. 10B, which is taken along direction E-E' according to an embodiment of the disclosure.

Referring to FIGS. 8, 9, 10A, and 10B, "X" in an orthogonal coordinate system of two or three axes may mean the length direction of the electronic device 101 (e.g., the electronic device 101 in FIGS. 1, 2A, 2B, and 3), "Y" may mean the width direction of the electronic device 101, and "Z" may mean the thickness direction of the electronic device 101. In addition, in an embodiment of the disclosure, "Z" may mean a first direction (a +Z-axis direction) or a second direction (a −Z-axis direction), "X" may mean a +X-axis direction or a −X-axis direction, and "Y" may mean a +Y-axis direction or a −Y-axis direction.

Referring to FIGS. 8, 9, 10A, and 10B, the electronic device (e.g., the electronic device 101 in FIGS. 1, 2A, 2B, and 3) may include a speaker module mounting structure disposed in the housing (e.g., the housing 310 in FIGS. 2A and 2B). The mounting structure may include a speaker module 410, a plate 360 and a bracket 332 of the housing 310 that provide an inner space in which the speaker module 410 is disposed, and a printed circuit board 540 electrically connected to at least a portion of the speaker module 410. As another example, the mounting structure may include a sealing member 521 or 522 disposed between the plate 360 and the bracket 332 so as to define a resonance space 410b of the speaker module 410. As another example, the mounting structure may include a gasket 560 disposed on a conduit 580 facing the outside from the speaker module 410. The speaker module 410 may include a speaker component 410a in the form of an integrated circuit chip and the resonance space 410b.

The configuration of the plate 360, the bracket 332, and the speaker component 410a of the mounting structure of FIGS. 4, 5A, 5B, 6A, 6B, 7A, and 7B may be applicable to the configuration of the plate 360, the bracket 332, and the speaker component 410a of the speaker module mounting structure of FIGS. 8, 9, 10A, and 10B. Hereinafter, the printed circuit board 540 and/or the sealing member 521 different from those of the mounting structure of FIGS. 4, 5A, 5B, 6A, 6B, 7A, and 7B will be described.

According to various embodiments, the bracket 332 and the plate 360 are disposed so as to at least partially face each other, and it is possible to provide a seating space in which the speaker component 410a is capable of being seated and the resonance space 410 due to a rib structure of the bracket 332 facing the second direction (the −Z-axis direction) and a rib structure of the plate 360 facing the first direction (the +Z-axis direction). With respect to a surface of the speaker component 410a, the resonance space 410b may include a first portion (e.g., the first portion S1 in FIG. 10A) facing the third direction (the +Y-axis direction) and a second portion (e.g., the second portion S2 in FIG. 10A) facing the fourth direction (the −Y-axis direction), and the first portion S1 and the second portion S2 may be partitioned from each other.

According to various embodiments, a printed circuit board 540 may be disposed in the inner space between the plate 360 and the bracket 332. On the printed circuit board 540, a processor, a communication module, or the like may be mounted in the form of an integrated circuit chip. The printed circuit board 540 may have a shape one side of which is open and may be disposed to surround the edges of the speaker component 410a.

According to various embodiments, the side surface of the speaker module 410 may include a first side surface 411, a second side surface 412, a third side surface 413, and a fourth side surface 414, which have a predetermined thickness. The printed circuit board 540 may be configured to open at least a portion of the first side surface 411 of the speaker module 410, and may be manufactured in a shape that surrounds the remaining portion of the first side surface 411, the second side surface 412, the third side surface 413, and the fourth side surface 414. For example, the first side surface 411 facing the +Y axis direction may include a (1-1)th side surface 411a that faces the speaker component 410a, and a (1-2)th side surface 411b that extends from the (1-1)th side surface 411a and does not face the speaker component 410a.

According to an embodiment, the (1-1)th side surface 411*a* of the speaker module 410 may be disposed adjacent to an edge of the electronic device 101, and a conduit 480 configured to guide sound emission may be disposed in the direction the (1-1)th side surface 411*a* faces. According to an embodiment, the printed circuit board 540 from which one side (e.g., the portion facing the (1-1)th side surface 411*a* of the speaker component 410*a*) is removed may allow the speaker component 410*a* to be disposed closer to an edge of the electronic device 101 than a printed circuit board manufactured in the form of a closed loop (e.g., the printed circuit board 34 in FIG. 5A). Accordingly, it is possible to reduce the length of the conduit that guides the sound emission and to increase the size of the conduit.

According to an embodiment, the printed circuit board 540 may be disposed on the side surface of the speaker component 410*a*, and may include a first area 541 disposed adjacent to the speaker module 410 and a second area 542 disposed in the speaker module 410. The first area 541 may be located in an area other than the resonance space 410*b* surrounding the speaker component 410*a*, and may be disposed so as not to overlap the sealing member 521. The second area 542 extends to at least one surface of the speaker module 410 (e.g., the (1-2)th side surface 411*b* and/or the second side surface 412), and may define a contact with the speaker component 410*a* to be electrically connected.

According to an embodiment, compared with the second area 342 of the printed circuit board 540 of FIGS. 4, 5A, 5B, 6A, 6B, 7A, and 7B, the second area 542 of the printed circuit board 540 may be substantially enlarged since the area inserted into the resonance space 410*b* extends into two side surfaces of the speaker module 410. As the second area 542 is inserted into the resonance space 410*b* in two directions (e.g., the (1-2)th side surface 411*b* and the second side surface 412 of the speaker module 410), a separate sealing member (e.g., the second sealing member 522) may also be disposed on each of two side surfaces of the second area 542 to seal the resonance space 410*b*.

According to an embodiment of the disclosure, the portion of the printed circuit board 540 that is inserted into the resonance space 410*b* to be connected to the speaker component 410*a* has been described only with two side surfaces of the speaker module 410, but is not limited thereto. Depending on the design of the printed circuit board 540 and the structure of the inner space, a partial area of the printed circuit board 540 may be disposed in the resonance space 410*b* to penetrate a plurality of surfaces of the speaker module 410 other than the area in which the conduit is disposed, and additional sealing may be required.

According to various embodiments, a sealing member 521 or 522 may be disposed between the plate 360 and the bracket 332 so as to seal the inner space. The inner space may include a space in which the speaker component 410*a* is mounted and a resonance space 410*b*. A plurality of the sealing members 521 or 522 may be disposed depending on a position. For example, a first sealing member 521 may be disposed to surround the entire area of the inner space in a closed loop shape. As another example, according to the configuration of the printed circuit board 540 in addition to the area corresponding to the speaker component 410*a*, or in order to enlarge the resonance space 410*b*, the first sealing member 521 may be provided in a shape covering a portion of the printed circuit board 540. The first sealing member 521 may be provided in various shapes including a curved portion corresponding to the shape of the inner space. As another example, a second sealing member 522 may be provided to seal the periphery of the second area 542 of the printed circuit board 540 inserted into the resonance space 410*b*. For example, at least a portion of the second sealing member 522 may be disposed along the (1-2)th side surface 411*b* and the second side surface 412 of the speaker module 410 and may cover one surface of the second area 542 together with the first sealing member 521 so as to block leakage of sound waves in the resonance space to a path other than a predetermined section and to seal the one surface to prevent inflow of foreign matter including fluid.

Figure 11:
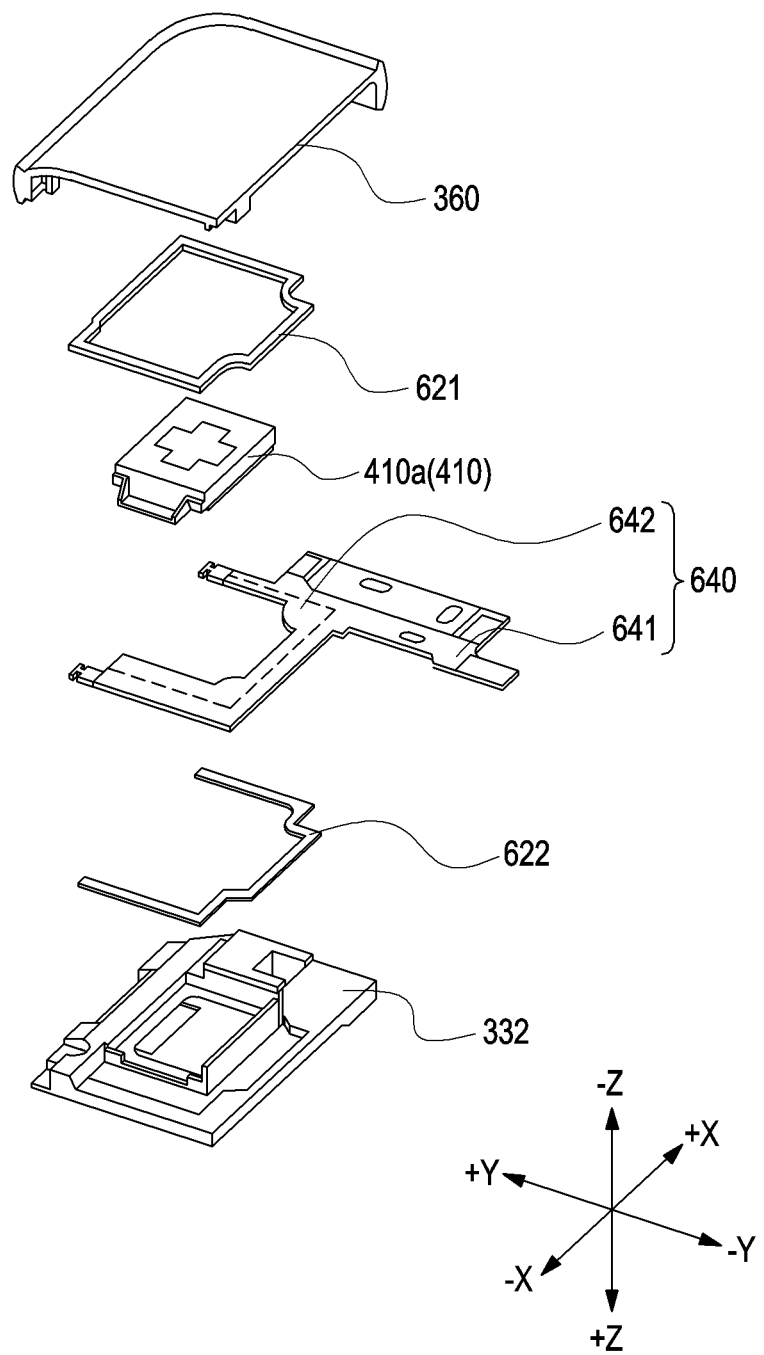
FIG. 11 is an exploded perspective view illustrating a speaker module mounting structure, which is disposed on one side of an electronic device in a separated state according to an embodiment of the disclosure.

FIG. 11 is an exploded perspective view illustrating a speaker module mounting structure, which is disposed on one side of an electronic device in a separated state according to an embodiment of the disclosure.

Figure 12:
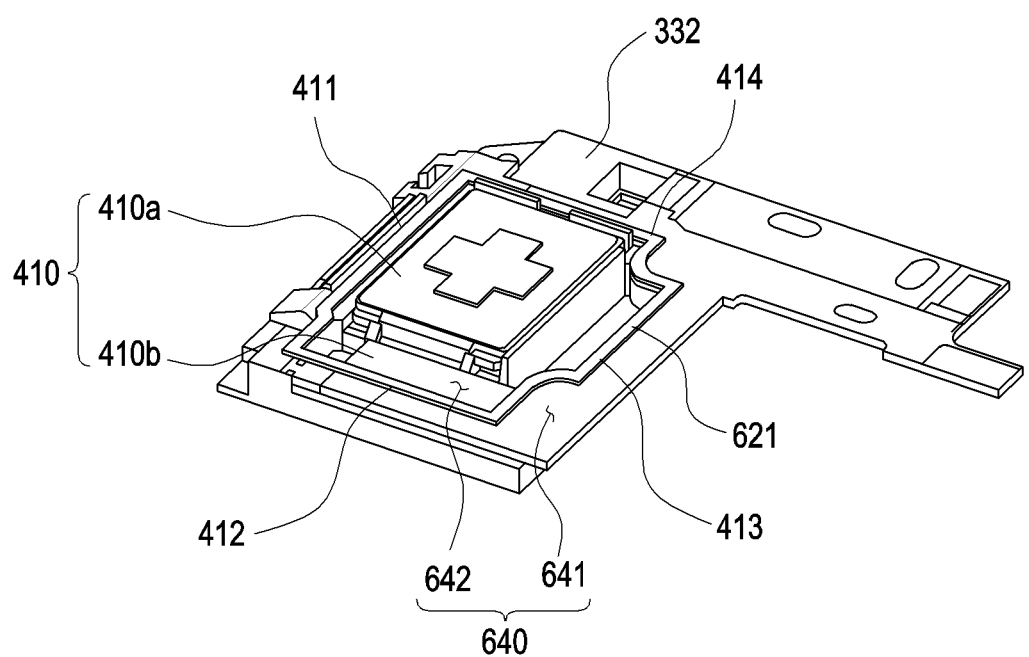
FIG. 12 is a rear perspective view illustrating a speaker module mounting structure, which is disposed on one side of an electronic device according to an embodiment of the disclosure.

FIG. 12 is a rear perspective view illustrating a speaker module mounting structure, which is disposed on one side of an electronic device according to an embodiment of the disclosure.

Figure 13A:
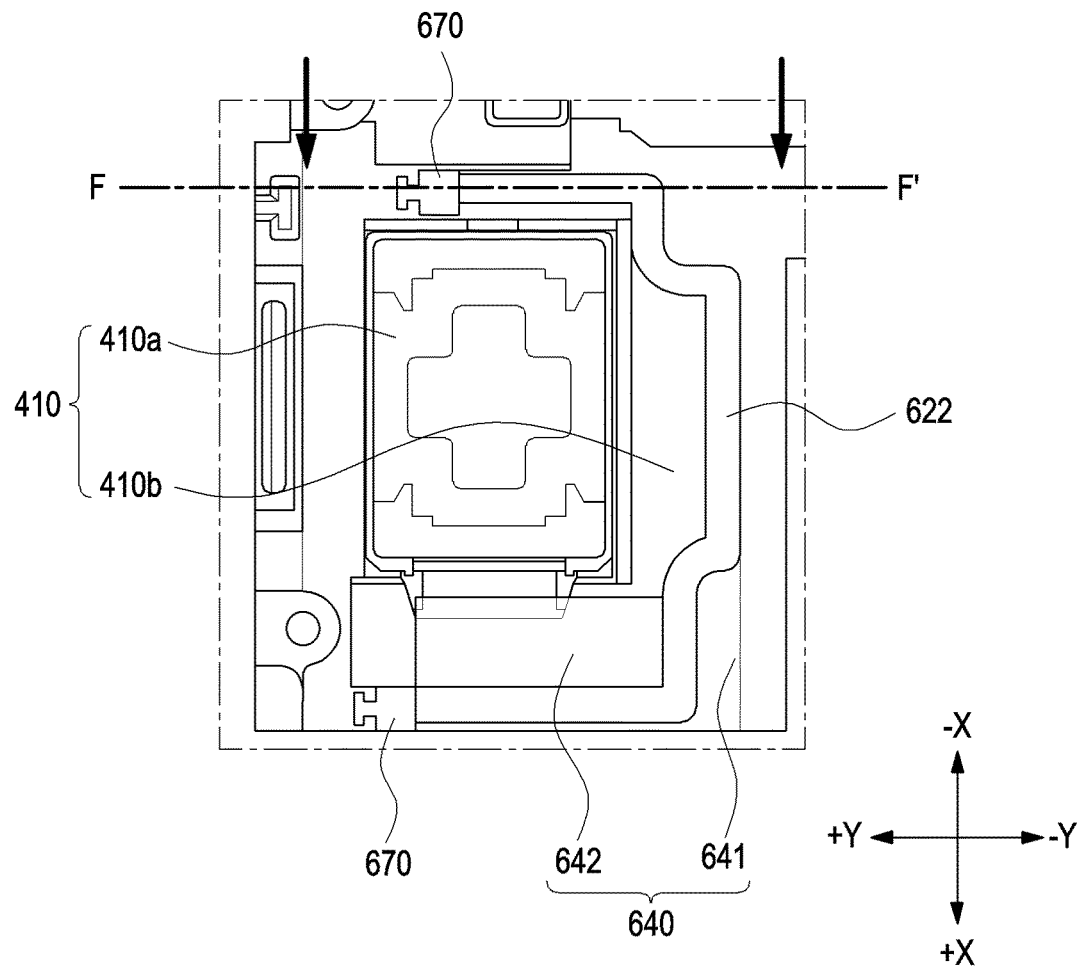
FIG. 13A is a perspective view illustrating a connection relationship between a speaker component and a partial area of a printed circuit board according to an embodiment of the disclosure.

FIG. 13A is a perspective view illustrating a connection relationship between the speaker component and a partial area of a printed circuit board according to an embodiment of the disclosure.

Figure 13B:
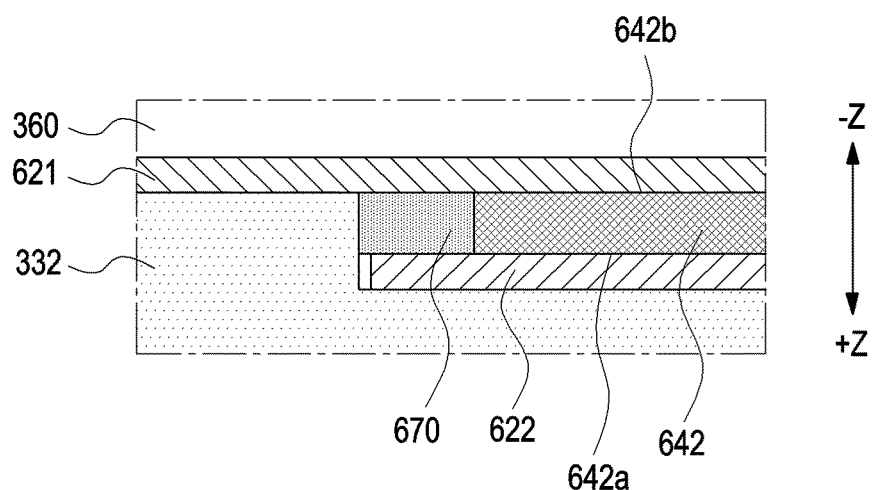
FIG. 13B is a cross-sectional view of FIG. 13A taken along direction F-F' according to an embodiment of the disclosure.

FIG. 13B is a cross-sectional view taken along direction F-F' in FIG. 13A according to an embodiment of the disclosure.

Referring to FIGS. 11, 12, 13A, and 13B, "X" in an orthogonal coordinate system of two or three axes may mean the length direction of the electronic device 101 (e.g., the electronic device 101 in FIGS. 1, 2A, 2B, and 3), "Y" may mean the width direction of the electronic device 101, and "Z" may mean the thickness direction of the electronic device 101. In addition, in an embodiment of the disclosure, "Z" may mean a first direction (a +Z-axis direction) or a second direction (a −Z-axis direction), "X" may mean a +X-axis direction or a −X-axis direction, and "Y" may mean a +Y-axis direction or a −Y-axis direction.

Referring to FIGS. 11, 12, 13A, and 13B, the electronic device (e.g., the electronic device 101 in FIGS. 1, 2A, 2B, and 3) may include a speaker module mounting structure disposed in the housing (e.g., the housing 310 in FIGS. 2A and 2B). The mounting structure may include a speaker module 410, a plate 360 and a bracket 332 of the housing 310 that provide an inner space in which the speaker module 410 is disposed, and a printed circuit board 640 electrically connected to at least a portion of the speaker module 410. As another example, the mounting structure may include a sealing member 621 or 622 disposed between the plate 360 and the bracket 332 so as to define a resonance space 410*b* of the speaker module 410. The speaker module 410 may include a speaker component 410*a* in the form of an integrated circuit chip and the resonance space 410*b*.

The configuration of the plate 360, the bracket 332, and the speaker component 410*a* of the mounting structure of FIGS. 4, 5A, 5B, 6A, 6B, 7A, and 7B may be applicable to the configuration of the plate 360, the bracket 332, and the speaker component 410*a* of the mounting structure of FIGS. 11, 12, 13A, and 13B. Hereinafter, the printed circuit board 640, the sealing member 621 or 622, and the correction member 670 different from those of the mounting structure of FIGS. 4, 5A, 5B, 6A, 6B, 7A, and 7B will be described.

According to various embodiments, the bracket 332 and the plate 360 are disposed so as to at least partially face each other, and it is possible to provide a seating space in which the speaker component 410*a* is capable of being seated and the resonance space 410 due to a rib structure of the bracket 332 facing the second direction (the −Z-axis direction) and a rib structure of the plate 360 facing the first direction (the +Z-axis direction).

According to various embodiments, a printed circuit board 640 may be disposed in the inner space between the plate 360 and the bracket 332. On the printed circuit board 640, a processor, a communication module, or the like may be mounted in the form of an integrated circuit chip. The printed circuit board 640 may have a shape one side of which is open and may be disposed to surround the edges of the speaker component 410*a*.

According to various embodiments, the speaker module 410 may include a resonance space 410*b* defined by the speaker component 410*a*, and the ribs of the plate 360 and the bracket 332 surrounding the periphery of the speaker component 410*a*, and a first sealing member 621 or 622. The side surface of the speaker module 410 may include a first side surface 411, a second side surface 412, a third side surface 413, and a fourth side surface 414, which have a predetermined thickness. The printed circuit board 640 may be configured to open at least a portion of the first side surface 411 of the speaker module 410, and may be manufactured in a shape that surrounds the second side surface 412, the third side surface 413, and the fourth side surface 414. For example, the first side surface 411 of the speaker module 410 may be disposed adjacent to an edge of the electronic device 101, and a conduit configured to guide to sound emission may be disposed in the direction the first side surface 411 faces. According to an embodiment, the printed circuit board 640 from which one side (e.g., the portion facing the first side surface 411 of the speaker component 410*a*) is removed may allow the speaker component 410*a* to be disposed closer to an edge of the electronic device 101 than a printed circuit board manufactured in the form of a closed loop (e.g., the printed circuit board 34 in FIG. 5A). Accordingly, it is possible to reduce the length of the conduit that guides the sound emission and to increase the size of the conduit.

According to an embodiment, the printed circuit board 640 may be disposed on the side surface of the speaker component 410*a*, and may include a first area 641 disposed adjacent to the speaker module 410 and a second area 642 disposed in the speaker module 410. The first area 641 may be located in an area other than the resonance space 410*b* surrounding the speaker component 410*a*, and may be disposed so as not to overlap the sealing member 621 or 622. The second area 642 may extend to at least one surface of the speaker module 410 (e.g., the second side surface 412, the third side surface 413, and/or the fourth side surface 414), and the portion extending to the second side surface 412 may define a contact with the speaker component 410*a* to be electrically connected.

According to an embodiment, compared with the second area 642 of the printed circuit board 640 of FIGS. 4, 5A, 5B, 6A, 6B, 7A, and 7B, the second area 642 of the printed circuit board 640 may be substantially enlarged since the area inserted into the resonance space 410*b* extends into three side surfaces of the speaker module 410 (e.g., the second side surface 412, the third side surface 413, and the fourth side surface 414). As the second area 642 is inserted into the resonance space 410*b* in three directions, a separate sealing member for sealing the resonance space 410*b* (e.g., the second sealing member 622) may also be disposed on each of the portions defined by the second area 642.

According to various embodiments, a sealing member 621 or 622 may be disposed between the plate 360 and the bracket 332 so as to seal the inner space. The inner space may include a space in which the speaker component 410*a* is mounted and a resonance space 410*b*. A plurality of the sealing members 621 or 622 may be disposed depending on a position. For example, a first sealing member 621 may be disposed to surround the entire area of the inner space in a closed loop shape. The first sealing member 621 may be provided in various shapes including a curved portion corresponding to the shape of the inner space. As another example, a second sealing member 622 may be provided to seal the periphery of the second area 642 of the printed circuit board 640 inserted into the resonance space 410*b*. For example, at least a portion of the second sealing member 622 may be disposed to extend from the second side surface 412 of the speaker module 410 along the fourth side surface 414 and may cover one surface of the second area 642 together with the first sealing member 621 so as to block leakage of sound waves in the resonance space to a path other than a predetermined section.

Referring to FIGS. 13A and 13B, the side surface of the speaker component 410*a* may include a first surface, a second surface, a third surface, and a fourth surface which have a predetermined thickness and face different directions. The surface of the speaker component 410*a* facing −X-axis direction may include at least one pin and a pad to be electrically connected to a portion of the second area 642 of the printed circuit board 640.

According to various embodiments, the printed circuit board 640 may be disposed on the side surface of the speaker component 410*a*, and may include a first area 641 disposed adjacent to the speaker module 410 and a second area 642 disposed in the speaker module 410. According to an embodiment, the second area 642 of the printed circuit board 640 may include a separate mounting structure as a structure inserted into the resonance space 410*b*.

On the mounting structure, the first sealing member 621, a second area 642 of the printed circuit board 640, the second sealing member 622, and the bracket 332 may be sequentially disposed from the upper plate 360 toward the first direction (the +Z-axis direction). For example, the mounting structure may be provided as the first sealing member 621 and the second sealing member 622 surrounding the periphery of the second area 642 of the printed circuit board 640 seated in a recess defined in the bracket 332. As another example, the mounting structure may include at least one correction member 670 disposed on a side surface of the printed circuit board 640.

According to an embodiment, the second sealing member 622 may be disposed in the recess of the bracket 332, and the second area 642 of the printed circuit board 640 may be disposed on one surface of the second sealing member 622. For example, the first surface 642*a* of the second area 642 facing the first direction (the +Z-axis direction) and the second sealing member 422 may be disposed so as to be in contact with each other so that the first surface 642*a* can be substantially entirely covered. The correction member 670 may correct a step between the printed circuit board 640 and surrounding structures. For example, a separation space or a step between the bracket 332 and the second area 642 may occur due to the thickness of the printed circuit board 640 itself, a connection terminal disposed on one surface of the printed circuit board 640, or the like. The correction member 670 may be disposed on a side end surface of the printed circuit board 640 in order to correct the step occurring due to a thickness between structures. As another example, the correction member 670 may be inserted into the recess in the bracket 332, and may be disposed at each of opposite ends of the second area 642.

According to an embodiment, the first sealing member 621 may be disposed between the plate 360 and the second area 642 of the printed circuit board 640 so as to be in contact with the second surface 642b of the second area 642 facing the second direction (the −Z-axis direction). The second sealing member 422 may overlap the second surface 642 to substantially entirely cover the second surface 642.

According to an embodiment, the sealing member 621 or 622 and the correction member 670 may include an elastic material, such as sponge, rubber, poron, or tape that elastically surrounds the second area 642. For example, the first sealing member 621 may be provided using poron. The second sealing member 622 may be provided using poron, and the correction member 670 may be provided using rubber.

The mounting structure according to the disclosure configured to seal the second area 642 of the printed circuit board 640 inserted into and disposed in the resonance space 410b is capable of sealing the periphery of the second area 642, thereby blocking leakage of sound waves in the resonance space 410b to a path other than a predetermined section. In addition, areas other than the second area 642 of the printed circuit board 640 may be designed not to overlap the resonance space 410b, and contact between the printed circuit board 640 and the speaker module 410 is maintained to a minimum. Thus, it is possible to improve the resonance space 410b to be expanded, and to enlarge the mounting space of the printed circuit board 640.

An electronic device (e.g., the electronic device 101 in FIGS. 1, 2A, 2B, and 3) according to various embodiments of the disclosure may include: a housing (e.g., 310 in FIG. 2A) including a front plate (e.g., 302 in FIG. 2A) facing a first direction (e.g., +Z-axis direction in FIG. 4), a rear plate (e.g., 360 in FIG. 4) facing a second direction (−Z-axis direction in FIG. 4) opposite to the first direction, and an outer wall (a portion of 332 in FIG. 4) which surrounds a space between the front plate and the rear plate and in which a conduit (e.g., 480 in FIG. 6A) extending to an outside is disposed; a speaker module (e.g., 410 in FIG. 4) located in the space adjacent to the conduit; a printed circuit board (e.g., 340 in FIG. 4) disposed along at least a portion of a side surface of the speaker module, and formed along a periphery of an area between the outer wall in which the conduit is disposed and the speaker module; and a first sealing member (e.g., 421 in FIG. 4) disposed between the rear plate and a bracket, and formed in a closed curve along an edge of the speaker module.

According to various embodiments, the electronic device may further include the bracket (e.g., 332 in FIG. 4) disposed so as to face at least a portion of the rear plate to face the first direction, the bracket 332 including the outer wall and coupled with the rear plate to form an inner space in which the speaker module is seated.

According to various embodiments, the speaker module may include a speaker component (e.g., 410a in FIG. 5B), and a resonance space (e.g., 410b in FIG. 5B) disposed along the periphery of the speaker component and configured to resonate the sound output from the speaker component.

According to various embodiments, the resonance space of the speaker module may include: a first portion (e.g., S1 in FIG. 6A) surrounded by the rear plate, the bracket 332, and one surface of the speaker component facing a third direction (e.g., +Y-axis direction in FIG. 6A) perpendicular to the first direction; and a second portion (e.g., S2 in FIG. 6A) which is partitioned from the first portion and is surrounded by the rear plate and another surface of the speaker component facing a fourth direction (e.g., −Y-axis direction in FIG. 6A) opposite to the third direction.

According to various embodiments, the printed circuit board has an open loop shape in which an area between the outer wall and the speaker module is open, and may include a first area (e.g., 341 in FIG. 4) that does not overlap with the first sealing member and is disposed to be spaced apart from the speaker component, and a second area (e.g., 342 in FIG. 4) extending from the first area and inserted into and disposed in the resonance space.

According to various embodiments, the second area of the printed circuit board may be disposed to pass through the side surface of the speaker module, and at least one end portion of the second area may form a contact point electrically connected with the speaker component.

According to various embodiments, the electronic device may further include a second sealing member (e.g., 422 in FIG. 4) disposed to cover at least a portion of the second area of the printed circuit board, and configured to block leakage of sound waves inside the resonance space to a path other than a predetermined section together with the first sealing member.

According to various embodiments, the second sealing member may be seated in a recess configured in the bracket 332, and may be disposed between the bracket 332 and the second area.

According to various embodiments, the second sealing member may be disposed to cover at least one of one surface or a side surface of the second area of the printed circuit board facing the first direction.

According to various embodiments, the printed circuit board may have an open loop shape in which an area between the outer wall and the speaker module is open. The printed circuit board may include a first area that does not overlap the first sealing member and is disposed to be spaced apart from the speaker component, and a second area extending from the first area and inserted into and disposed in the resonance space. The electronic device may further include at least one correction member (e.g., 670 in FIG. 13a) disposed at an end of the second area in order to correct a step between the second area and the peripheral structure.

According to various embodiments, the correction member may be inserted into a recess configured in the bracket 332, and may be made of a material including an elastic material disposed at each of opposite ends of the second area.

According to various embodiments, the electronic device may further include a second sealing member disposed to cover at least a portion of the second area of the printed circuit board, and configured to block leakage of sound waves in the resonance space to a path other than a predetermined section together with the first sealing member and the correction member.

According to various embodiments, the side surface of the speaker module may have a predetermined thickness and may include a first side surface (411 in FIG. 5B), a second side surface (412 in FIG. 5B), a third side surface (413 in FIG. 5B), and a fourth side surface (e.g., 414 in FIG. 5B) which face different directions, the printed circuit board may be configured to open the first side surface of the speaker module in which the conduit is provided, and may be disposed to surround the second side surface, the third side surface, and the fourth side surface, and the second area (e.g., 342 in FIG. 5B) of the printed circuit board (e.g., 340 in FIG. 5B) may extend into the second side surface, and a portion extending into the second side surface may form a contact point electrically connected with the speaker component.

According to various embodiments, the side surface of the speaker module may have a predetermined thickness and may include a first side surface (411 in FIG. 9), a second side surface (412 in FIG. 9), a third side surface (413 in FIG. 9), and a fourth side surface (e.g., 414 in FIG. 9) which face different directions, the printed circuit board may be configured to open a portion (e.g., 411*a* in FIG. 9) of the first side surface of the speaker module in which the conduit is provided, and may have a shape surrounding the remaining portion (e.g., 411*b* in FIG. 9) of the first side surface, the second side surface, the third side surface, and the fourth side surface, and the second area (e.g., 542 in FIG. 9) of the printed circuit board (e.g., 540 in FIG. 9) may extend into the remaining portion of the first side surface and the second side surface, and a portion extending into the second side surface may form a contact point electrically connected with the speaker component.

According to various embodiments, the side surface of the speaker module may have a predetermined thickness and may include a first side surface (411 in FIG. 12), a second side surface (412 in FIG. 12), a third side surface (413 in FIG. 12), and a fourth side surface (e.g., 414 in FIG. 12) which face different directions, the printed circuit board may be configured to open the first side surface of the speaker module in which the conduit is provided, and may be disposed to surround the second side surface, the third side surface, and the fourth side surface, and the second area (e.g., 642 in FIG. 12) of the printed circuit board (e.g., 640 in FIG. 12) may extend into the second side surface, the third side surface, and the fourth side surface, and a portion extending into the second side surface may form a contact point electrically connected with the speaker component.

According to various embodiments, A speaker module mounting structure may include a bracket 332 including an outer wall and a conduit passing through the outer wall to an inner space, a plate disposed to face the bracket 332 and coupled to the outer wall of the bracket 332 to form the inner space, a speaker module located in the inner space adjacent to the conduit, a printed circuit board disposed along at least a portion of a side surface of the speaker module, and a first sealing member disposed between the plate and the bracket 332 along an edge of the speaker module. The printed circuit board may have an open loop shape in which an area between the outer wall in which the conduit is provided and the speaker module is open, and may be disposed along the periphery of the open area so as to prevent overlapping between the conduit and a portion of the printed circuit board.

According to various embodiments, the first sealing member may be disposed between the plate and the bracket 332 to be in contact therewith so as to prevent sound waves in the inner space from leaking to a path other than a predetermined section.

According to various embodiments, the speaker module may include a speaker component and a resonance space located around the speaker component. The printed circuit board may include a first area that does not overlap the first sealing member and is disposed to be spaced apart from the speaker component, and a second area extending from the first area and inserted into and disposed in the resonance space.

According to various embodiments, the second area of the printed circuit board may be disposed to pass through the side surface of the speaker module, and at least one end portion of the second area may define a contact with the speaker component to be electrically connected.

According to various embodiments, the speaker module mounting structure may further include a second sealing member disposed to cover at least a portion of the second area of the printed circuit board.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing including a front plate facing a first direction, a rear plate facing a second direction opposite to the first direction, and an outer wall which surrounds a space between the front plate and the rear plate and in which a conduit extending to an outside is disposed;
   a speaker module located in the space adjacent to the conduit;
   a printed circuit board disposed along at least a portion of a side surface of the speaker module, and formed along a periphery of an area between the outer wall in which the conduit is disposed and the speaker module; and
   a first sealing member disposed between the rear plate and a bracket, and formed in a closed curve along an edge of the speaker module.

2. The electronic device of claim 1, further comprising:
   the bracket disposed to face at least a portion of the rear plate to face the first direction, the bracket comprising the outer wall and coupled with the rear plate to form an inner space in which the speaker module is seated.

3. The electronic device of claim 2, wherein the speaker module comprises:
   a speaker component; and
   a resonance space disposed along a periphery of the speaker component and configured to resonate sound output from the speaker component.

4. The electronic device of claim 3, wherein the resonance space comprises:
   a first portion surrounded by the rear plate, the bracket, and one surface of the speaker component facing a third direction perpendicular to the first direction; and
   a second portion partitioned from the first portion and surrounded by the rear plate and another surface of the speaker component facing a fourth direction opposite to the third direction.

5. The electronic device of claim 3, wherein the printed circuit board has an open loop shape in which an area between the outer wall and the speaker module is open, the printed circuit board comprising:
   a first area that does not overlap with the first sealing member and is disposed to be spaced apart from the speaker component; and
   a second area extending from the first area and inserted into and disposed in the resonance space.

6. The electronic device of claim 5,
   wherein the second area of the printed circuit board is disposed to pass through the side surface of the speaker module, and
   wherein at least one end portion of the second area forms a contact point electrically connected with the speaker component.

7. The electronic device of claim 5, further comprising:
   a second sealing member disposed to cover at least a portion of the second area of the printed circuit board, and configured to block leakage of sound waves inside the resonance space other than to a predetermined section together with the first sealing member.

8. The electronic device of claim 7, wherein the second sealing member is seated in a recess configured in the bracket, and is disposed between the bracket and the second area.

9. The electronic device of claim 7, wherein the second sealing member is disposed to cover at least one of one surface or a side surface of the second area of the printed circuit board facing the first direction.

10. The electronic device of claim 5,
wherein the side surface of the speaker module comprises a first side surface, a second side surface, a third side surface, and a fourth side surface which have a predetermined thickness and face different directions,
wherein the printed circuit board is configured to open the first side surface of the speaker module in which the conduit is provided, and is disposed to surround the second side surface, the third side surface, and the fourth side surface, and
wherein the second area of the printed circuit board extends into the second side surface, and a portion extending into the second side surface forms a contact point electrically connected with the speaker component.

11. The electronic device of claim 5,
wherein the side surface of the speaker module comprises a first side surface, a second side surface, a third side surface, and a fourth side surface which have a predetermined thickness and face different directions,
wherein the printed circuit board is configured such that a portion of the first side surface of the speaker module, in which the conduit is provided, is open, and has a shape surrounding a remaining portion of the first side surface, the second side surface, the third side surface, and the fourth side surface, and
wherein the second area of the printed circuit board extends into a remaining portion of the first side surface and the second side surface, and a portion extending into the second side surface forms a contact point electrically connected with the speaker component.

12. The electronic device of claim 5,
wherein the side surface of the speaker module comprises a first side surface, a second side surface, a third side surface, and a fourth side surface which have a predetermined thickness and face different directions,
wherein the printed circuit board is configured such that the first side surface of the speaker module, in which the conduit is provided, is open, and is disposed to surround the second side surface, the third side surface, and the fourth side surface, and
wherein the second area of the printed circuit board extends into the second side surface, the third side surface, and the fourth side surface, and a portion extending into the second side surface forms a contact point electrically connected with the speaker component.

13. The electronic device of claim 3,
wherein the printed circuit board has an open loop shape in which an area between the outer wall and the speaker module is open, the printed circuit board comprising:
a first area that does not overlap with the first sealing member and is disposed to be spaced apart from the speaker component, and
a second area extending from the first area and inserted into and disposed in the resonance space, and
wherein the electronic device further comprises at least one correction member disposed at an end of the second area to correct a step between the second area and a peripheral structure.

14. The electronic device of claim 13, further comprising:
a second sealing member disposed to cover at least a portion of the second area of the printed circuit board, and configured to block leakage of sound waves in the resonance space other than to a predetermined section together with the first sealing member and the correction member,
wherein the correction member is inserted into a recess configured in the bracket, and is formed of a material comprising an elastic material disposed at each of both ends of the second area.

15. A speaker module mounting structure comprising:
a bracket comprising an outer wall and a conduit passing through the outer wall to an inner space;
a plate disposed to face the bracket and coupled to the outer wall of the bracket to form the inner space;
a speaker module located in the inner space adjacent to the conduit;
a printed circuit board disposed along at least a portion of a side surface of the speaker module; and
a first sealing member disposed between the plate and the bracket along an edge of the speaker module,
wherein the printed circuit board has an open loop shape in which an area between the outer wall in which the conduit is provided and the speaker module is open, and is disposed along a periphery of the open area to prevent overlapping between the conduit and a portion of the printed circuit board.

* * * * *